(12) United States Patent
Dai et al.

(10) Patent No.: US 11,011,862 B2
(45) Date of Patent: May 18, 2021

(54) ELECTRICAL CONNECTOR

(71) Applicant: LOTES CO., LTD, Keelung (TW)

(72) Inventors: Yong Jun Dai, Keelung (TW); Zhi Li He, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 16/887,289

(22) Filed: May 29, 2020

(65) Prior Publication Data

US 2020/0403344 A1 Dec. 24, 2020

(30) Foreign Application Priority Data

Jun. 24, 2019 (CN) .......................... 201910549930.5
May 13, 2020 (CN) .......................... 202010401093.4

(51) Int. Cl.
*H01R 13/24* (2006.01)
*H01R 4/02* (2006.01)
*H01R 12/55* (2011.01)
*H01R 12/71* (2011.01)

(52) U.S. Cl.
CPC .......... *H01R 13/2414* (2013.01); *H01R 4/02* (2013.01); *H01R 12/55* (2013.01); *H01R 12/714* (2013.01); *H01R 13/2492* (2013.01)

(58) Field of Classification Search
CPC .............. H01R 13/2442; H01R 13/245; H01R 13/2457
See application file for complete search history.

(56) References Cited

U.S. PATENT DOCUMENTS

| | | | |
|---|---|---|---|
| 4,591,230 A | 5/1986 | Roldan | |
| 10,855,016 B2 * | 12/2020 | Dai | ............. H01R 13/2442 |

FOREIGN PATENT DOCUMENTS

| | | |
|---|---|---|
| CN | 1565151 A | 1/2005 |
| CN | 1613169 A | 5/2005 |
| CN | 2770129 Y | 4/2006 |
| CN | 201130746 Y | 10/2008 |
| CN | 201266712 Y | 7/2009 |
| CN | 109361094 A | 2/2019 |
| CN | 109713482 A | 5/2019 |

* cited by examiner

*Primary Examiner* — Ross N Gushi
(74) *Attorney, Agent, or Firm* — Locke Lord LLP; Tim Tingkang Xia, Esq.

(57) ABSTRACT

An electrical connector includes a body provided with multiple accommodating holes running through the body vertically, and multiple terminals correspondingly accommodated in the accommodating holes. Each terminal includes a main body member and multiple conductive members. The main body member has two long edges extending in a front-rear direction and two short edges. The conductive members are arranged in the front-rear direction. Each conductive member has a base electrically connected to the main body member and an elastic arm. The base has a vertical flat plate portion downward covering the main body member. The elastic arm extends upward from an upper end of the flat plate portion. Each elastic arm has at least one contact portion located in front of the corresponding base to be downward abutted by the electronic component and to move downward. Two adjacent terminals in the front-rear direction are separately provided in the front-rear direction.

20 Claims, 23 Drawing Sheets

E-E

ELECTRICAL CONNECTOR

CROSS-REFERENCE TO RELATED PATENT APPLICATION

This non-provisional application claims priority to and the benefit of, pursuant to 35 U.S.C. § 119(a), patent application Serial No. CN201910549930.5 filed in China on Jun. 24, 2019 and patent application Serial No. CN202010401093.4 filed in China on May 13, 2020. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and particularly to an electrical connector electrically connected to a chip module.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An existing electrical connector is used to electrically connect a chip module to a circuit board, and includes a body and a plurality of terminals accommodated in the body.

Each of the terminals includes a metal plate and a conductive sheet fixed to the metal plate. The metal plate has two long edge opposite to each other in a front-rear direction and two short edges connecting the two long edges. The long edges are provided to extend in a left-right direction. The conductive sheet has a base and a plurality of elastic arms. The base is attached to the long edge at a front side of the metal plate, and the elastic arms are formed by extending upward from an upper end of the base and forward. Each of the elastic arms extends for a sufficient length to ensure it has stronger elasticity. The elastic arms are arranged in a row along the left-right direction, and upward abut the chip module to strengthen the electrical conductivity between the elastic arms and the chip module.

To prevent the two adjacent terminals in the front-rear direction from contacting each other and causing short-circuiting, and to ensure that when one of the terminals is damaged, replacing the damaged terminal individually may be facilitated, it is required to ensure that a big gap exists between the two adjacent terminals in the front-rear direction, and particularly to ensure the two adjacent terminals in the front-rear direction to be separately provided. That is, the two adjacent terminals in the front-rear direction do not overlap with each other in a vertical direction. However, the elastic arms are provided to extend forward along the short edges of the metal plate, such that a horizontal space between the two adjacent terminals in the front-rear direction is located between the two adjacent long edges of the two terminals, resulting in the horizontal space to be large, thereby not facilitating providing more quantity of terminals on the body.

Therefore, a heretofore unaddressed need to design a novel electrical connector exists in the art to address the aforementioned deficiencies and inadequacies.

SUMMARY

The present invention is directed to an electrical connector ensuring each of the terminals to be in good contact with an electronic component, and provide more quantity of terminals on the body.

To achieve the foregoing objective, the present invention adopts the following technical solutions.

An electrical connector is conductively connected to an electronic component. The electrical connector includes: a body, provided with a plurality of accommodating holes running through the body vertically; and a plurality of terminals, correspondingly accommodated in the accommodating holes, wherein each of the terminals comprises a main body member and a plurality of conductive members, the main body member has two long edges opposite to each other in a left-right direction and two short edges connecting the two long edges, each of the long edges is provided to extend in a front-rear direction, the conductive members are arranged in the front-rear direction, each of the conductive members has a base electrically connected to the main body member and an elastic arm formed by extending upward from the base and in the front-rear direction, the base has a flat plate portion being vertical, the flat plate portion downward covers the main body member correspondingly, and the elastic arm is formed by extending upward from an upper end of the flat plate portion, wherein the elastic arm of each of the conductive members has at least one contact portion located in front of the corresponding base of each of the conductive members, the contact portion is configured to be downward abutted by the electronic component and to move downward, and two adjacent ones of the terminals in the front-rear direction are separately provided in the front-rear direction.

In certain embodiments, a gap between one of the short edges located at a front side thereof and one of the bases of the conductive members adjacent thereto is greater than a gap between the other of the short edges located at a rear side thereof and another one of the bases of the conductive members adjacent thereto.

In certain embodiments, at least one side of a left side and a right side of the main body member is concavely provided with a plurality of grooves, and the grooves correspondingly position the bases of the conductive members.

In certain embodiments, each of the grooves and a corresponding one of the bases of the conductive members are fixed by soldering.

In certain embodiments, the grooves are distributed at the left side and the right side of the main body member, each of the bases of the conductive members has two insertion legs, the two insertion legs are inserted into two of the grooves provided at the left side and the right side of the main body member.

In certain embodiments, each of the bases of the conductive members has a supporting leg formed by bending forward and extending, and the supporting leg abuts the upper end of the main body member.

In certain embodiments, the supporting leg and the upper end of the main body member are correspondingly fixed by soldering.

In certain embodiments, the main body member comprises a metal plate and two connecting sheets respectively fixed to a left side and a right side of the metal plate, each of the connecting sheets is provided with the grooves running therethrough in the left-right direction, and the base is positioned in two of the grooves of the two connecting sheets.

In certain embodiments, a left side and a right side of each of the accommodating holes are respectively concavely provided with a plurality of positioning slots, the positioning slots run upward through the body, and two of the positioning slots opposite to each other in the left-right direction correspondingly position one of the bases of the conductive members.

In certain embodiments, the main body member comprises a metal plate and a connecting sheet fixed to one of a left side and a right side of the metal plate, the bases of the conductive members are integrally connected by the connecting sheet, and the flat plate portion is provided to form an angle relative to the connecting sheet.

In certain embodiments, the base comprises a bending portion bending forward and extending from the flat plate portion, and the bending portions of the conductive members are connected to the connecting sheet.

In certain embodiments, the main body member comprises two connecting sheets, each of the left side and a right side of the metal plate is fixed with one of the two connecting sheets, the conductive members are divided into two groups, one of the two connecting sheets is integrally connected with one of the two groups of the conductive members, and the other of the two connecting sheets is integrally connected with the other of the two groups of the conductive members.

In certain embodiments, the one of the two groups of the conductive members and the other of the two groups of the conductive members are alternately arranged in the front-rear direction.

In certain embodiments, the main body member comprises a metal plate and a plurality of connecting sheets respectively fixed to one of a left side and a right side of the metal plate, the connecting sheets are arranged in the front-rear direction, the base has a bending portion bending and extending from the flat portion, a rear side of each of the connecting sheets is integrally connected with one of the bending portions of the conductive members, and a front side of each of the connecting sheets is integrally connected with another one of the bending portions of the conductive members.

In certain embodiments, the two bending portions connected to each of the connecting sheets are defined as a first bending portion and a second bending portion, and a lower end of the second bending portion is lower than a lower end of the first bending portion; and each respective connecting sheet of the connecting sheets has a first protruding portion located below the first bending portion, the first protruding portion protrudes in the front-rear direction relative to a connecting location of the first bending portion and the respective connecting sheet, an upper end of the first protruding portion is higher than the lower end of the second bending portion, and a lower end of the first protruding portion is lower than the lower end of the second bending portion.

In certain embodiments, the first protruding portion and the metal plate are fixed by attaching.

In certain embodiments, each respective connecting sheet of the connecting sheets further has a second protruding portion located below the second bending portion, the second protruding portion protrudes in the front-rear direction relative to a connecting location of the second bending portion and the respective connecting sheet, and the second protruding portion and the first protruding portion protrude toward opposite directions.

In certain embodiments, the metal plate has a plurality of opening holes downward concavely provided on an upper end of the metal plate and provided separately in the front-rear direction, each of the opening holes accommodates the flat plate portion which is connected to one of the second bending portions of the conductive members, and the upper end of the protruding portion is not higher than the upper end of the metal plate.

In certain embodiments, the left side and the right side of the metal plate are respectively fixed with the connecting sheets, the two conductive members integrally connected to one of the connecting sheets at the left side of the metal plate and the two conductive members integrally connected to one of the connecting sheets at the right side of the metal plate are arranged to be one-by-one staggered in the front-rear direction, each of the connecting sheets has a recess, and the flat plate portion of one of the conductive members connected to one of the connecting sheets at one of the left side and the right side of the metal plate is accommodated in the recess of one of the connecting sheets at the other of the left side and the right side of the metal plate.

In certain embodiments, each of the terminals further comprises a stopping sheet fixed to one of a left side and a right side of the metal plate, the stopping sheet is made of a metal plate material, a plate thickness of the stopping sheet is less than a plate thickness of the metal plate, the stopping sheet has at least one stopping portion formed by extending away relative to the metal plate in the left-right direction, and the at least one stopping portion matches with the body to limit the corresponding terminal from moving upward.

Compared with the related art, the electrical connector according to certain embodiments of the present invention has the following beneficial effects:

The conductive members are arranged along the extending direction of the long edges, such that more quantity of the conductive members may be provided in the limited space of the main body member, and more contact points exist between each of the terminals and the electronic component, thus ensuring good electrical conductivity between each of the terminals and the electronic component. The vertical flat plate portion downward covers the main body member correspondingly, and the elastic arm is formed by extending upward from an upper end of the flat plate portion, ensuring most of the conductive members are located right above the main body member correspondingly, thereby reducing a space occupied by each terminal in the body along the left-right direction, and further facilitating providing more quantity of the terminals on the body. The elastic arms are provided to extend forward along the direction of the long edges, and the two adjacent terminals in the front-rear direction are separately provided in the front-rear direction, facilitating replacing one of the terminals being damaged individually, and a horizontal space occupied by the two adjacent terminals in the front-rear direction is located between the two adjacent short edges of the two terminals, such that the horizontal space is small, thereby facilitating providing more quantity of the terminals on the body.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
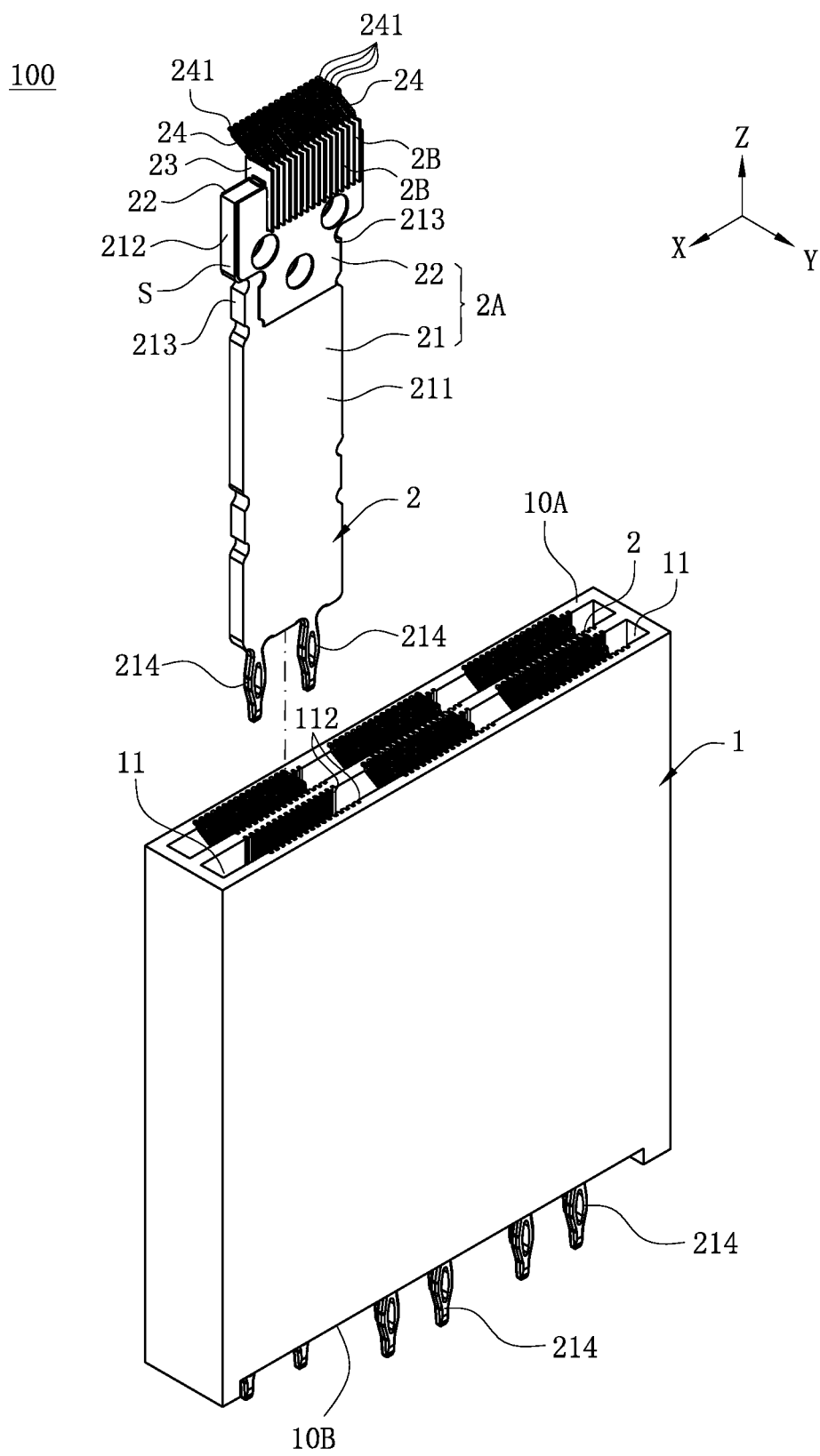
FIG. 1 is a perspective view of an electrical connector according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-23. In accordance with the purposes of this invention, as embodied and broadly described herein, this invention, in one aspect, relates to an electrical connector.

In certain embodiments of the present invention, a positive direction of an X-axis direction is defined as a forward direction in a front-rear direction, a positive direction of a Y-axis direction is defined as a leftward direction in a left-right direction, and a positive direction of a Z-axis direction is defined as an upward direction in a vertical direction.

FIG. 1 to FIG. 9 show an electrical connector 100 according to a first embodiment of the present invention, which includes a body 1 and a plurality of terminals 2 provided on the body 1. The terminals 2 are configured to electrically connect an electronic component 200 to a circuit board 300. In this embodiment, the electronic component 200 is a chip module. In other embodiments, the electronic component 200 may be other components.

Figure 6:
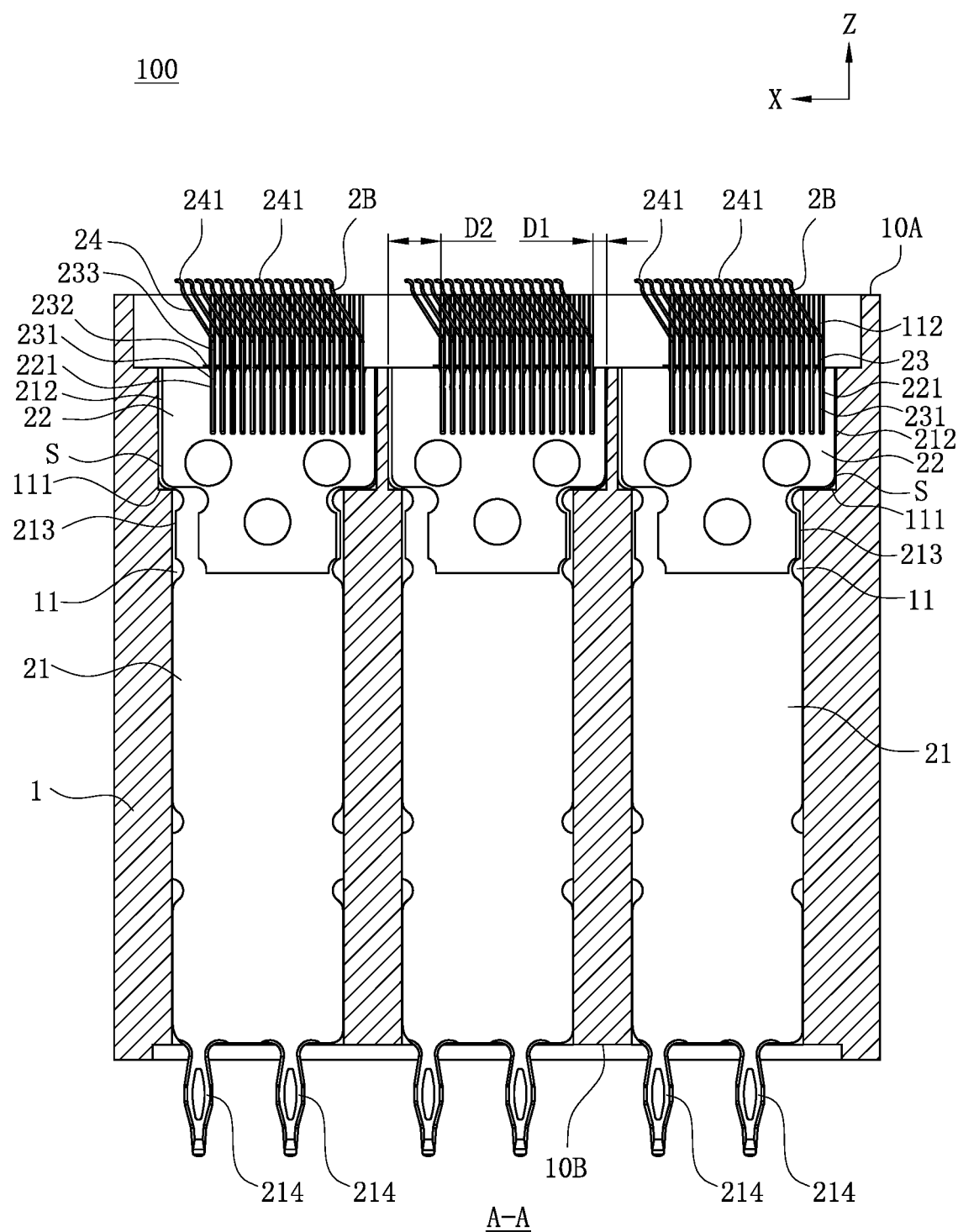
FIG. 6 is a sectional view of the electrical connector in FIG. 5, where the body is sectioned along the A-A direction.

As shown in FIG. 1 and FIG. 6, the body 1 is made of an insulating material. The body 1 has an upper surface 10A and a lower surface 10B vertically opposite to each other. The body 1 is further provided with a plurality of accommodating holes 11, and the accommodating holes 11 run through the upper surface 10A and the lower surface 10B of the body 1 vertically.

Figure 8:
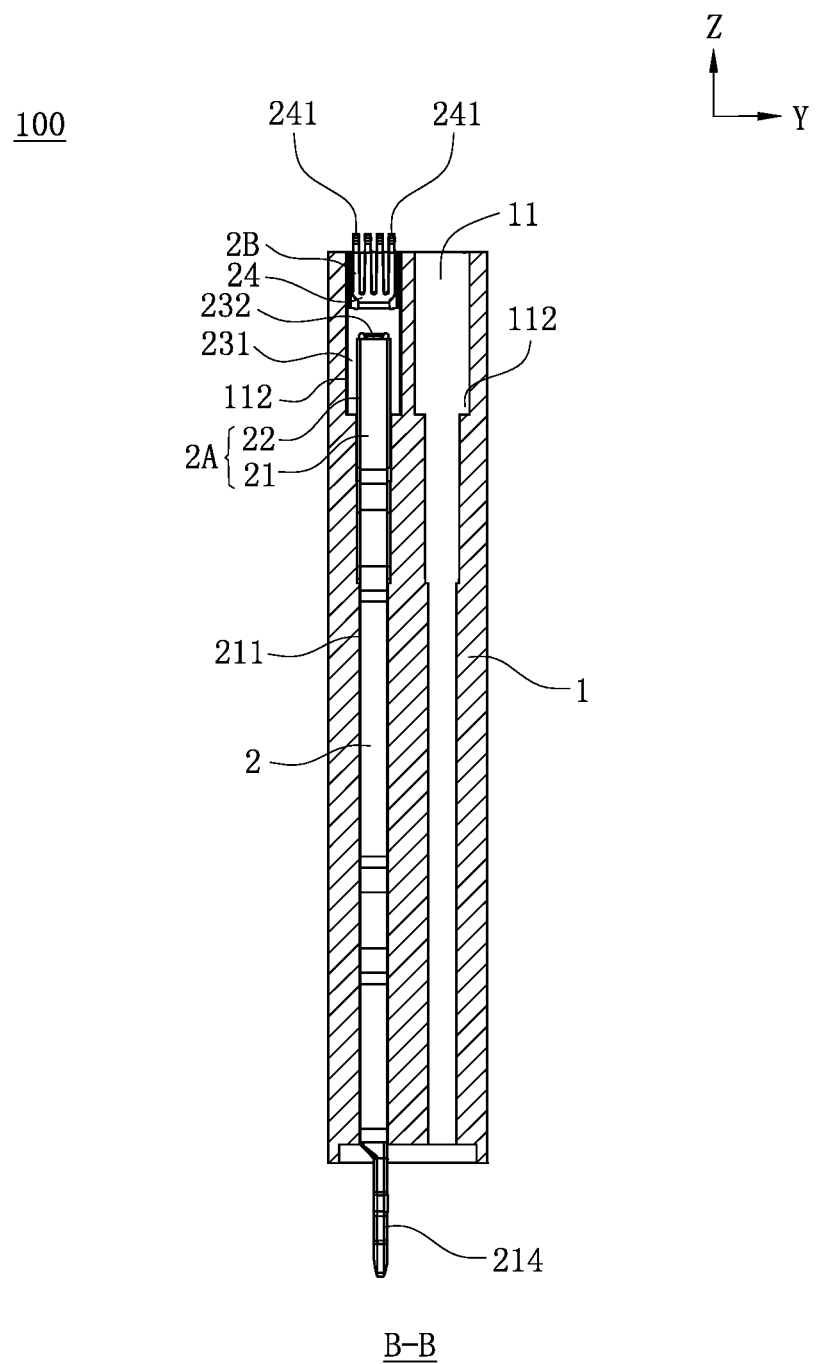
FIG. 8 is a sectional view of the electrical connector in FIG. 5, where the body is sectioned along the B-B direction.

As shown in FIG. 1, FIG. 6 and FIG. 8, two position limiting slots 111 are respectively provided at a front side and a rear side of each of the accommodating holes 11. Each of the position limiting slots 111 runs upward through the upper surface 10A of the body 1 and does not run downward through the lower surface 10B of the body 1. A plurality of positioning slots 112 are distributed at a left side and a right side of each of the accommodating holes 11, and the positioning slots 112 distributed at the left side and the right side of each of the accommodating holes 11 are provided to align in the Y-axis direction (also referring to FIG. 9). Each of the positioning slots 112 runs upward through the upper surface 10A of the body 1 and does not run downward through the lower surface 10B of the body 1. In other embodiments, the positioning slots 112 may be distributed only at one of the left side and the right side of each of the accommodating holes 11.

As shown in FIG. 1 and FIG. 6, the terminals 2 are correspondingly accommodated in the accommodating holes 11 downward from top thereof. The terminals 2 are power terminals. In other embodiments, the terminals 2 may be signal terminals.

As shown in FIG. 1 and FIG. 6, two adjacent terminals 2 in the front-rear direction are separately provided in the X-axis direction. In other words, the two adjacent terminals 2 in the front-rear direction do not overlap with each other in the Z-axis direction.

Figure 2:
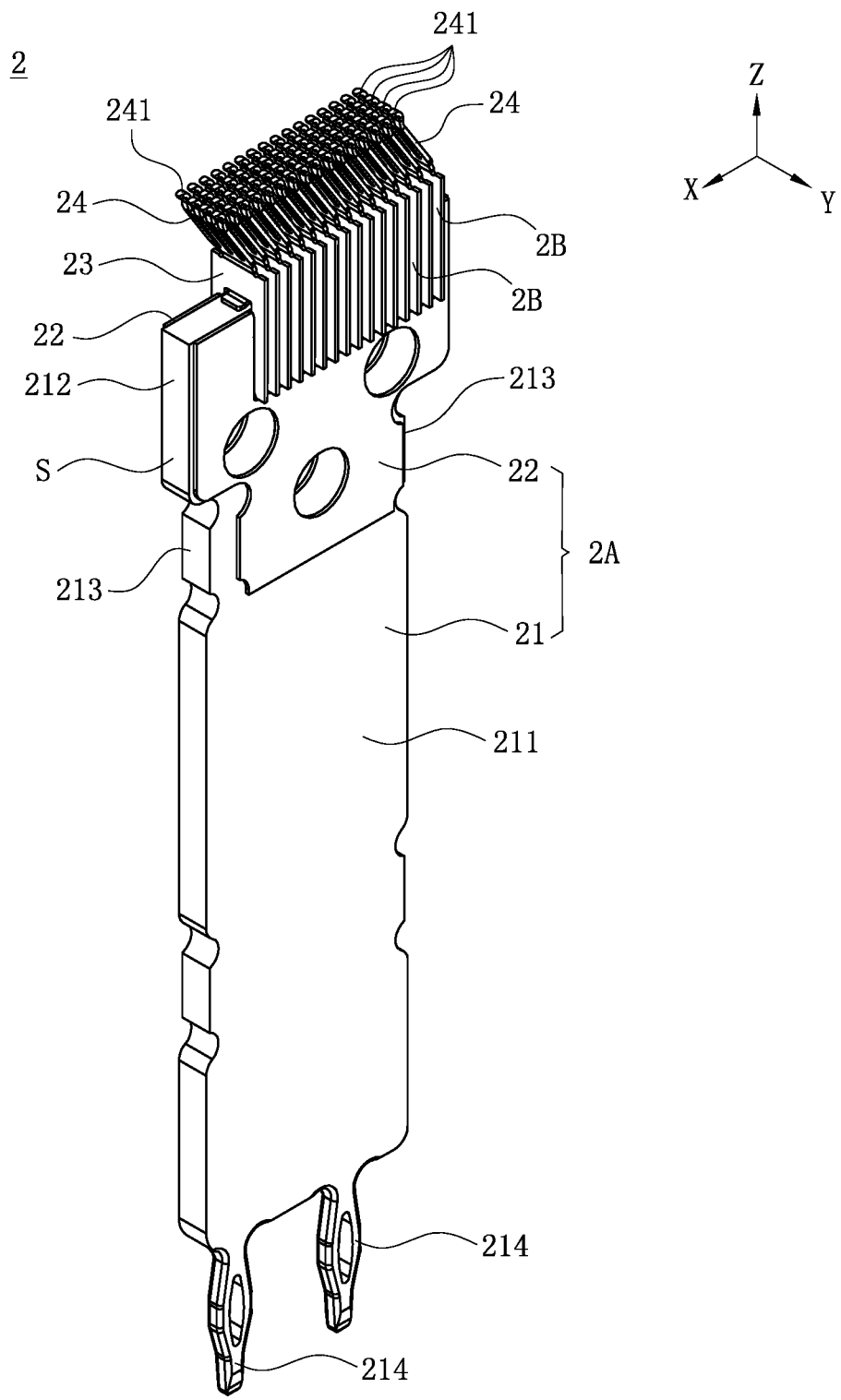
FIG. 2 is a perspective view of a terminal in FIG. 1.
Figure 3:
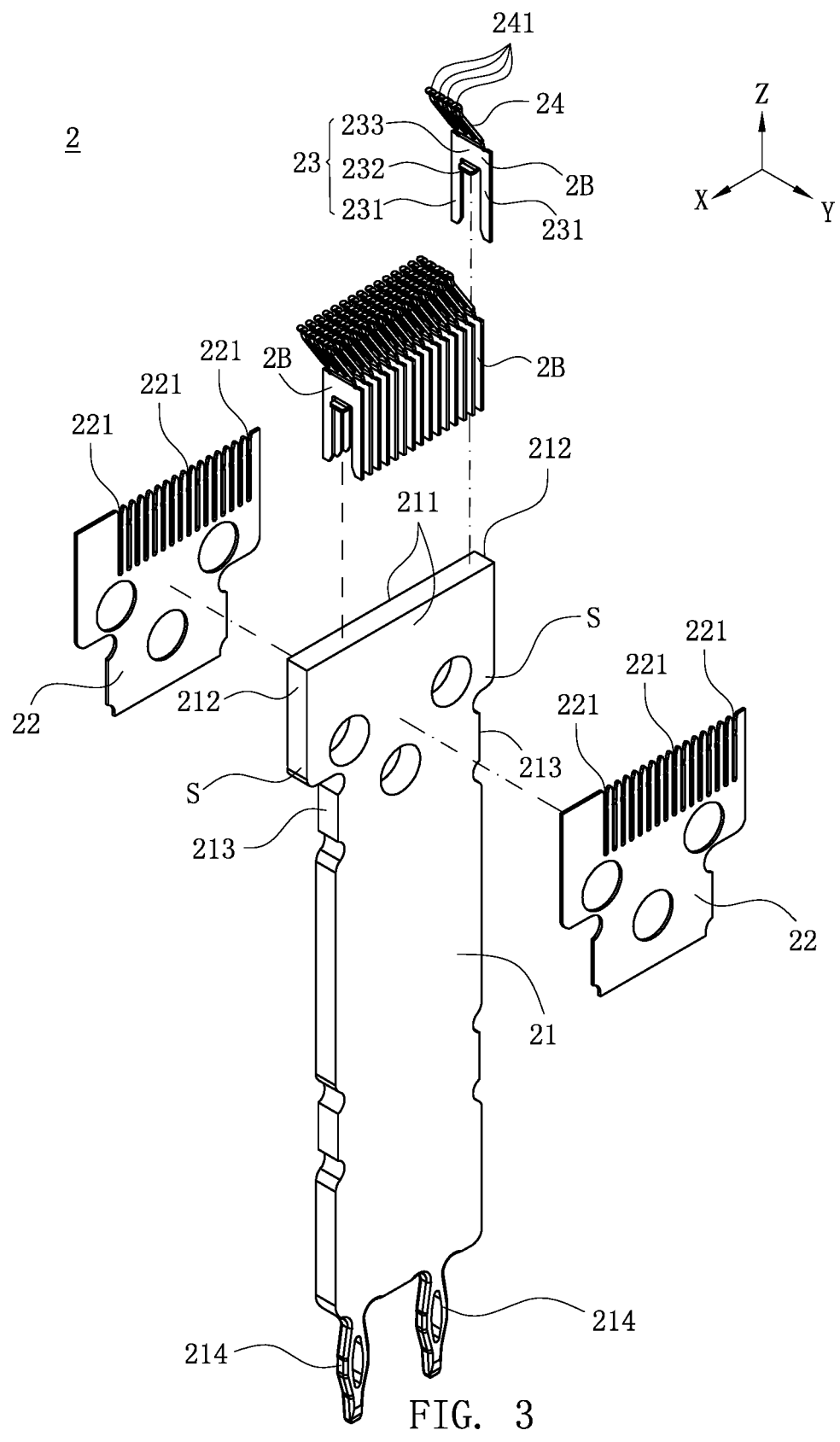
FIG. 3 is a perspective exploded view of the terminal in FIG. 2.

As shown in FIG. 2 and FIG. 3, each of the terminals 2 includes a main body member 2A and a plurality of conductive members 2B fixed to the main body member 2A. The conductive members 2B are arranged in a row in the X-axis direction.

As shown in FIG. 2, FIG. 3 and FIG. 6, the main body member 2A includes a metal plate 21 and two connecting sheets 22 fixed to a left side and a right side of the metal plate 21. A thickness of the metal plate 21 in the Y-axis direction is greater than a thickness of each of the connecting sheets 22 in the Y-axis direction. The two connecting sheets 22 and the metal plate 21 are fixed by laser soldering. The metal plate 21 and the corresponding accommodating hole 11 are in interference fit. In other embodiments, only one connecting sheet 22 is provided, and is fixed to one of the left side and the right side of the metal plate 21.

The metal plate 21 is made of a copper plate having high purity with model C110, which generally has an electrical conductivity of 90%. However, the hardness of the metal plate 21 is relatively weak.

Figure 4:
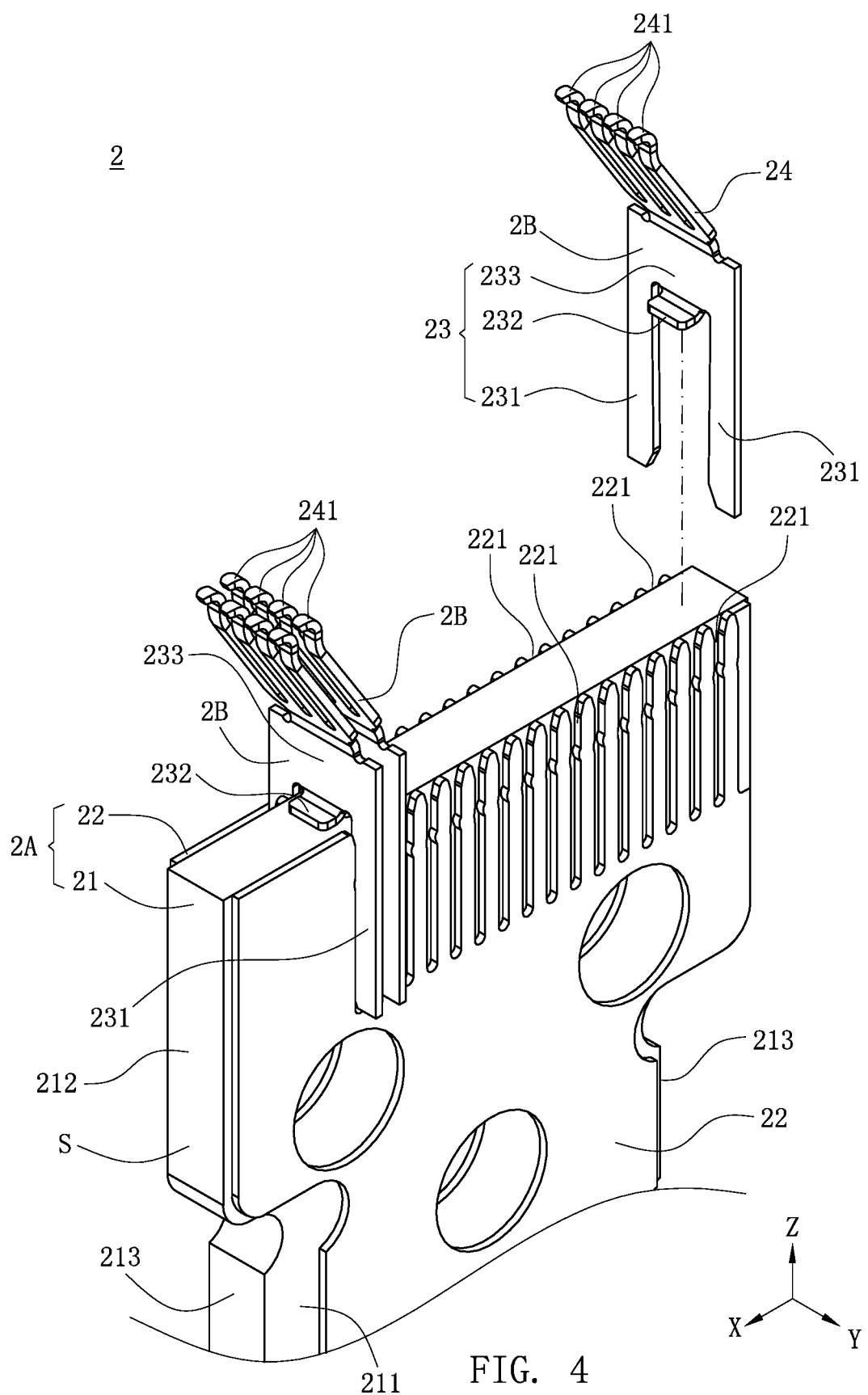
FIG. 4 is a partial perspective view of the terminal in FIG. 2.
Figure 5:
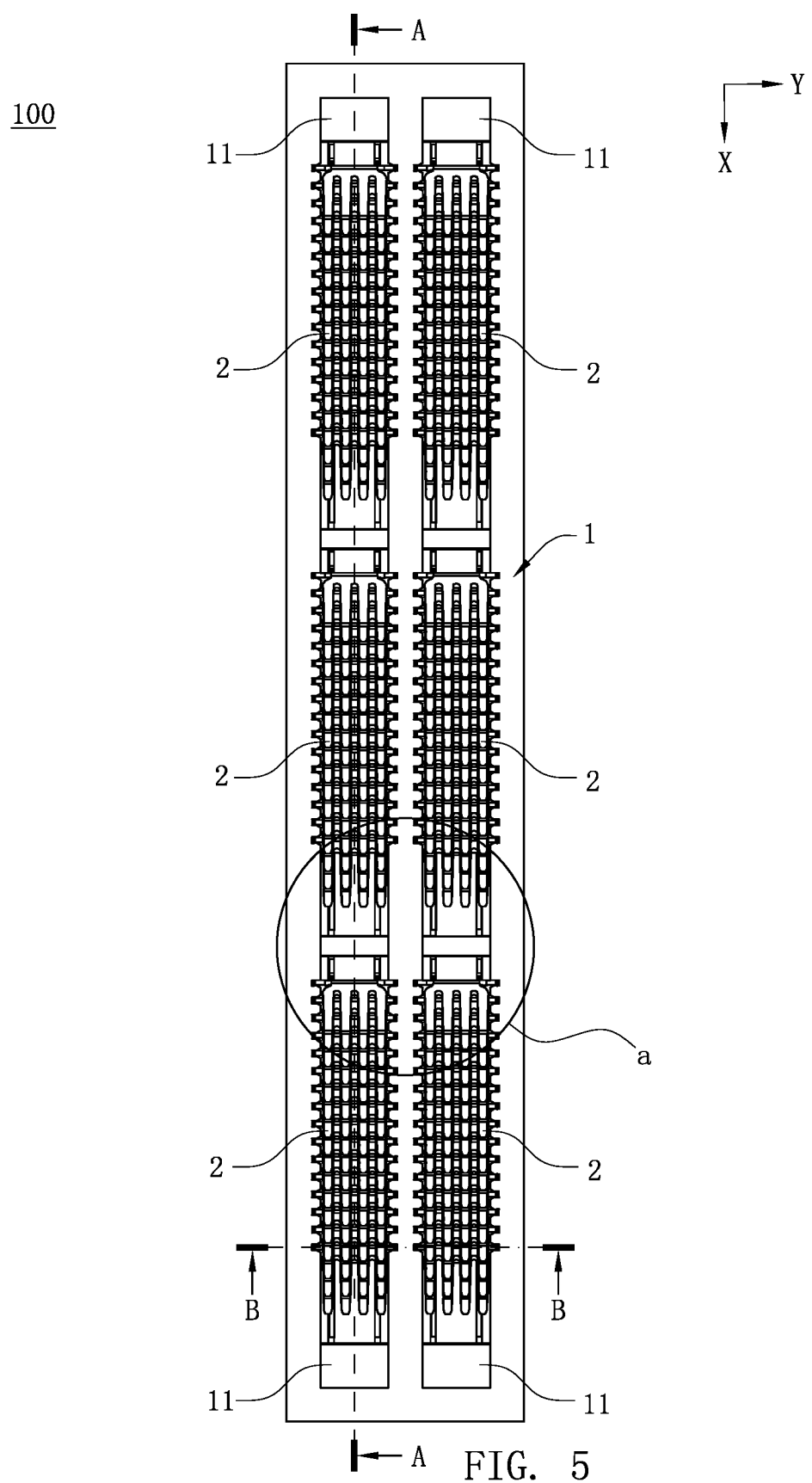
FIG. 5 is a top view of the electrical connector in FIG. 1.

As shown in FIG. 3 and FIG. 4, the metal plate 21 has two long edges 211 opposite to each other in the left-right direction and two short edges 212 connecting the two long edges 211. Each of the long edges 211 is provided to extend in the X-axis direction. In other words, the size of each of the long edges 211 in the X-axis direction is greater than the size of each of the short edges 212 in the Y-axis direction.

As shown in FIG. 2, FIG. 3 and FIG. 6, two position limiting portions S are respectively formed at a front side and a rear side of the metal plate 21. The metal plate 21 is formed with two notches 213 running downward therethrough below the position limiting portions S. Each of the position limiting portions S extends upward to the upper end of the corresponding metal plate 21, and each of the position limiting portions S protrudes downward out of the corresponding connecting sheet 22. The two position limiting portions S of each of the terminals 2 are correspondingly accommodated in the two position limiting slots 111 of a same one of the accommodating holes 11. The position limiting slots 111 are used to limit the corresponding position limiting portions S from moving downward.

Figure 7:
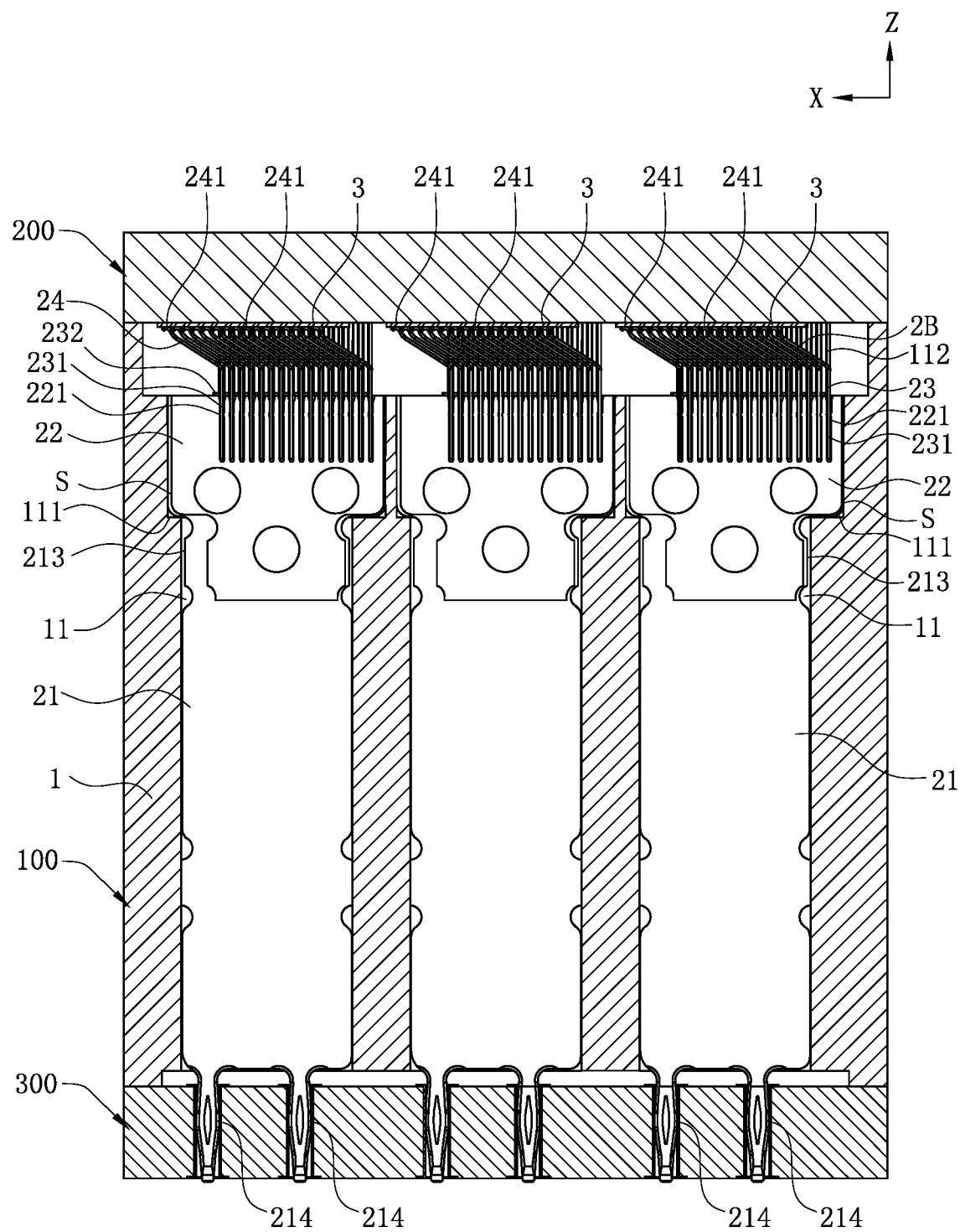
FIG. 7 is a schematic view of the electrical connector in FIG. 6 being conductively connected to an electronic component and a circuit board.

As shown in FIG. 2, FIG. 6 and FIG. 7, a lower end of the metal plate 21 is provided with two pins 214 arranged in the front-rear direction. The pins 214 are fisheye shaped, and the pins 214 extend downward beyond the corresponding accommodating hole 11. The pins 214 are inserted into the circuit board 300 and are electrically connected to the circuit board 300. In other embodiments, the quantity of the pins 214 can be any quantity less than the quantity of the corresponding conductive members 2B.

Each of the connecting sheets 22 is made of a copper plate with the model C7025, which generally has an electrical conductivity of 45%. That is, the electrical conductivity of each of the connecting sheets 22 is less than the electrically conductivity of the metal plate 21. However, the hardness of each of the connecting sheets 22 is stronger. That is, the hardness of each of the connecting sheets 22 is greater than the hardness of the metal plate 21 to strengthen the strength of the main body member 2A.

As shown in FIG. 3, the two connecting sheets 22 have identical structures. In other words, the structures, shapes and sizes of the two connecting sheets 22 are all identical. Thus, a same mold may be used to punch the two connecting sheets 22.

As shown in FIG. 2, FIG. 3 and FIG. 4, each of the connecting sheets 22 is formed with a plurality of grooves 221 downward concavely provided from an upper end thereof. Each of the grooves 221 runs upward through the corresponding connecting sheet 22 in the Y-axis direction and does not run downward through the corresponding connecting sheet 22. The grooves 221 of the two connecting sheets 22 are distributed at the left side and the right side of the metal plate 21, and the grooves 221 of the two connecting sheets 22 are provided to align in the Y-axis direction.

Each of the conductive members 2B is made of a copper plate with the model C7025. That is, the electrical conductivity of each of the conductive members 2B is equal to the electrical conductivity of each of the connecting sheets 22, and the hardness of each of the conductive members 2B is equal to the hardness of each of the connecting sheets 22.

As shown in FIG. 4, FIG. 6 and FIG. 8, each of the conductive members 2B has a base 23 and an elastic arm 24. The base 23 is electrically connected to the main body member 2A. The base 23 protrudes out of the left side and the right side of the corresponding main body member 2A in the Y-axis direction. A gap D1 between the short edge 212 at the rear side thereof and a base 23 adjacent thereto is less than a gap D2 between the short edge 212 at the front side thereof and another base 23 adjacent thereto. A left side and a right side of the base 23 are respectively positioned in two of the positioning slots 112 at the left side and the right side of the corresponding accommodating hole 11.

As shown in FIG. 4 and FIG. 8, each of the bases 23 has two insertion legs 231 opposite to each other in the left-right direction and provided separately, and a supporting leg 232 bending forward and extending relative to the insertion legs 231. The two insertion legs 231 are provided and inserted in two of the grooves 221 at the left side and the right side of the main body member 2A, and are fixed to the two corresponding grooves 221 by laser soldering. The supporting leg 232 abuts the upper end of the main body member 2A, and is fixed to the upper end of the main body member 2A by laser soldering. In other embodiments, the insertion legs 231 and the supporting leg 232 can be soldered and fixed together with the main body member 2A by solders.

As shown in FIG. 3 and FIG. 4, each of the bases 23 further has a flat plate portion 233 which is vertical. The two insertion legs 231 and the supporting leg 232 are all formed by extending from a lower end of the flat plate portion 233. The insertion legs 231 and the flat plate portion 233 are located in a same vertical plane. The supporting leg 232 bends forward for substantially 90° relative to the flat plate portion 233. The flat plate portion 233 is located right above the main body member 2A, and downward covers the main body member 2A correspondingly. In other words, the flat plate portion 233 occupies the space right above the main body member 2A.

As shown in FIG. 4 and FIG. 6, the elastic arm 24 is formed by bending upward and forward and extending from an upper end of the corresponding flat plate portion 233. The elastic arm 24 extends upward beyond the corresponding accommodating hole 11.

Figure 9:
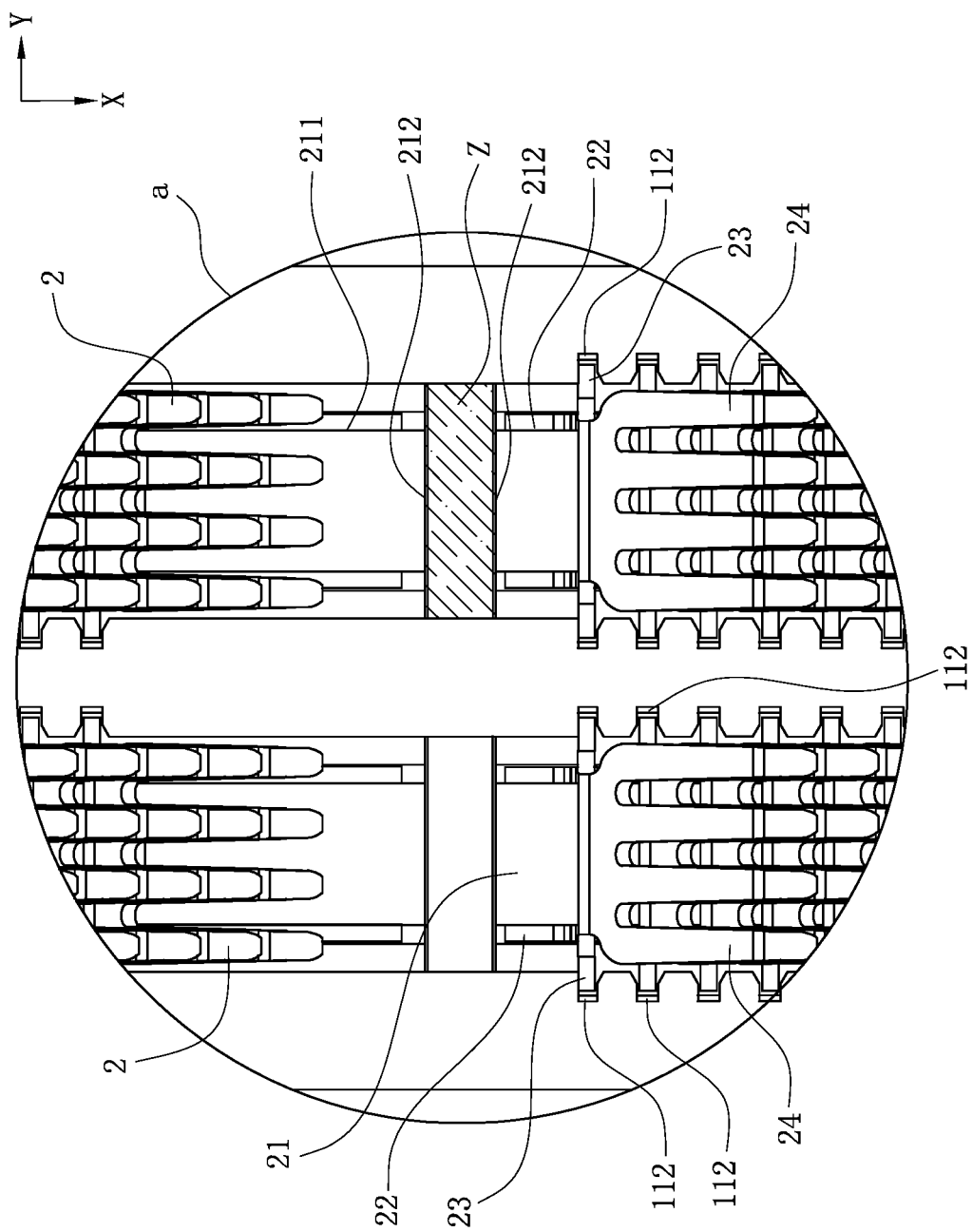
FIG. 9 is an enlarged view of the portion a in FIG. 5.
Figure 10:
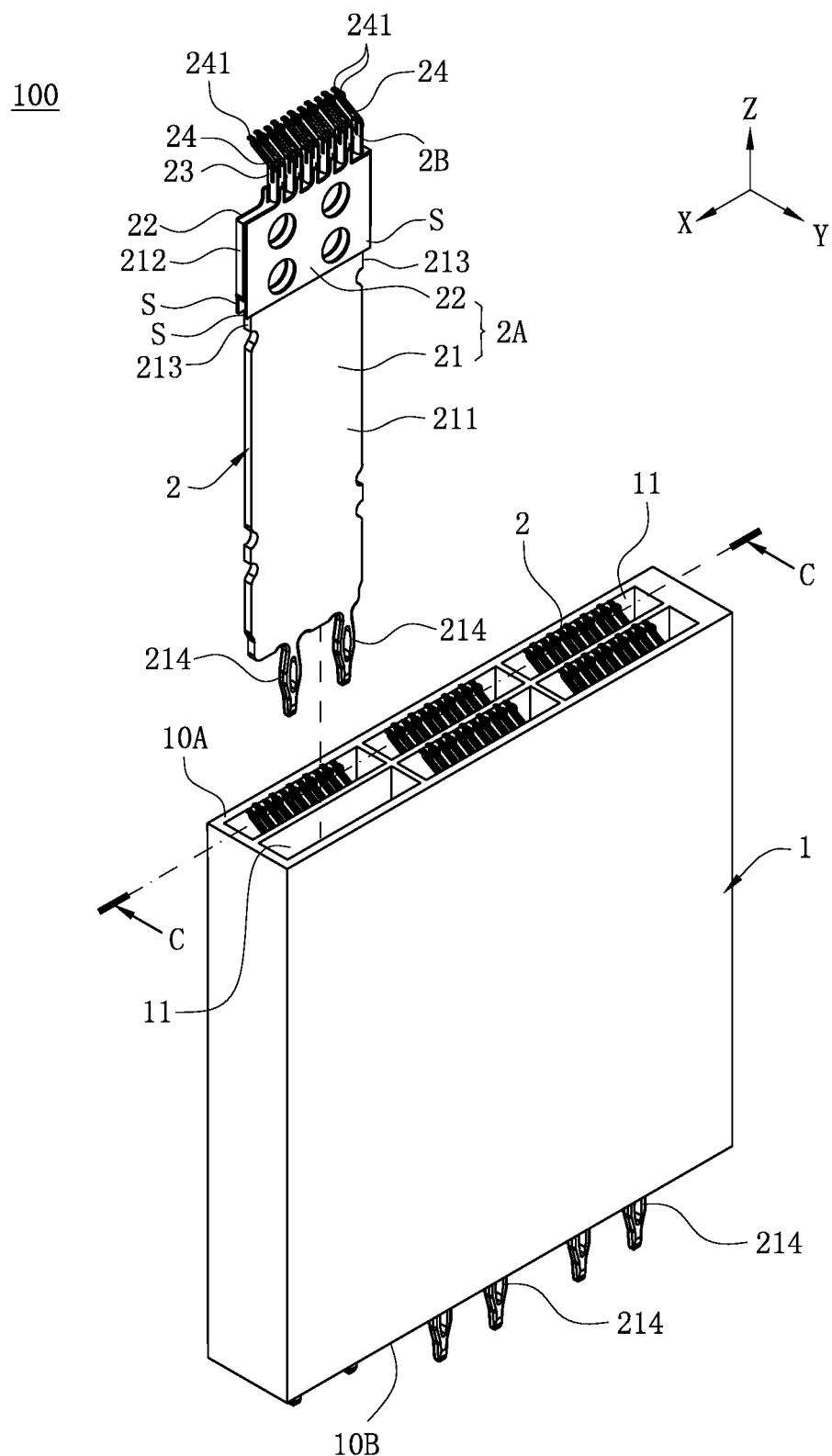
FIG. 10 is a perspective view of an electrical connector according to a second embodiment of the present invention.
Figure 11:
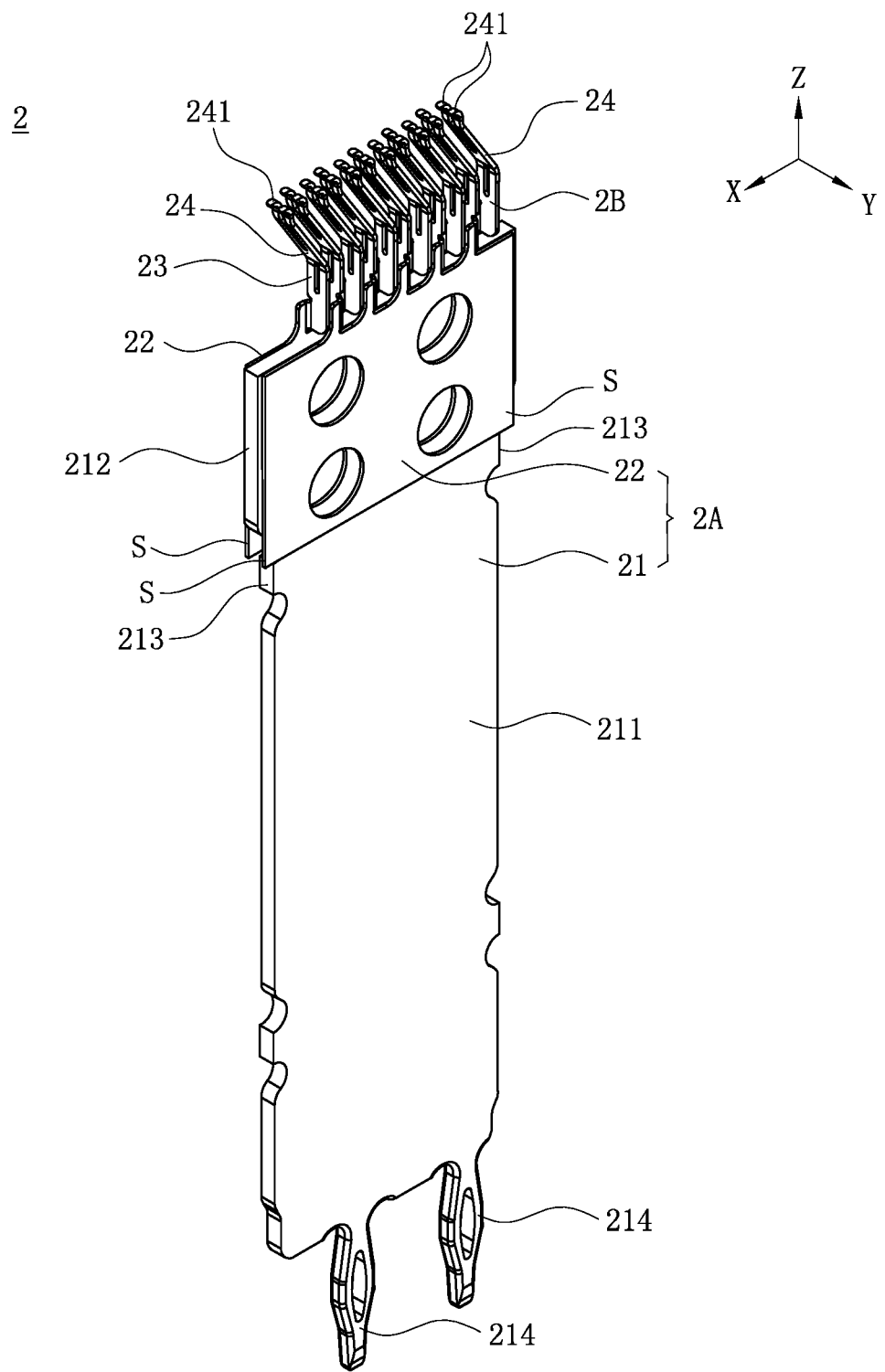
FIG. 11 is a perspective view of a terminal in FIG. 10.
Figure 12:
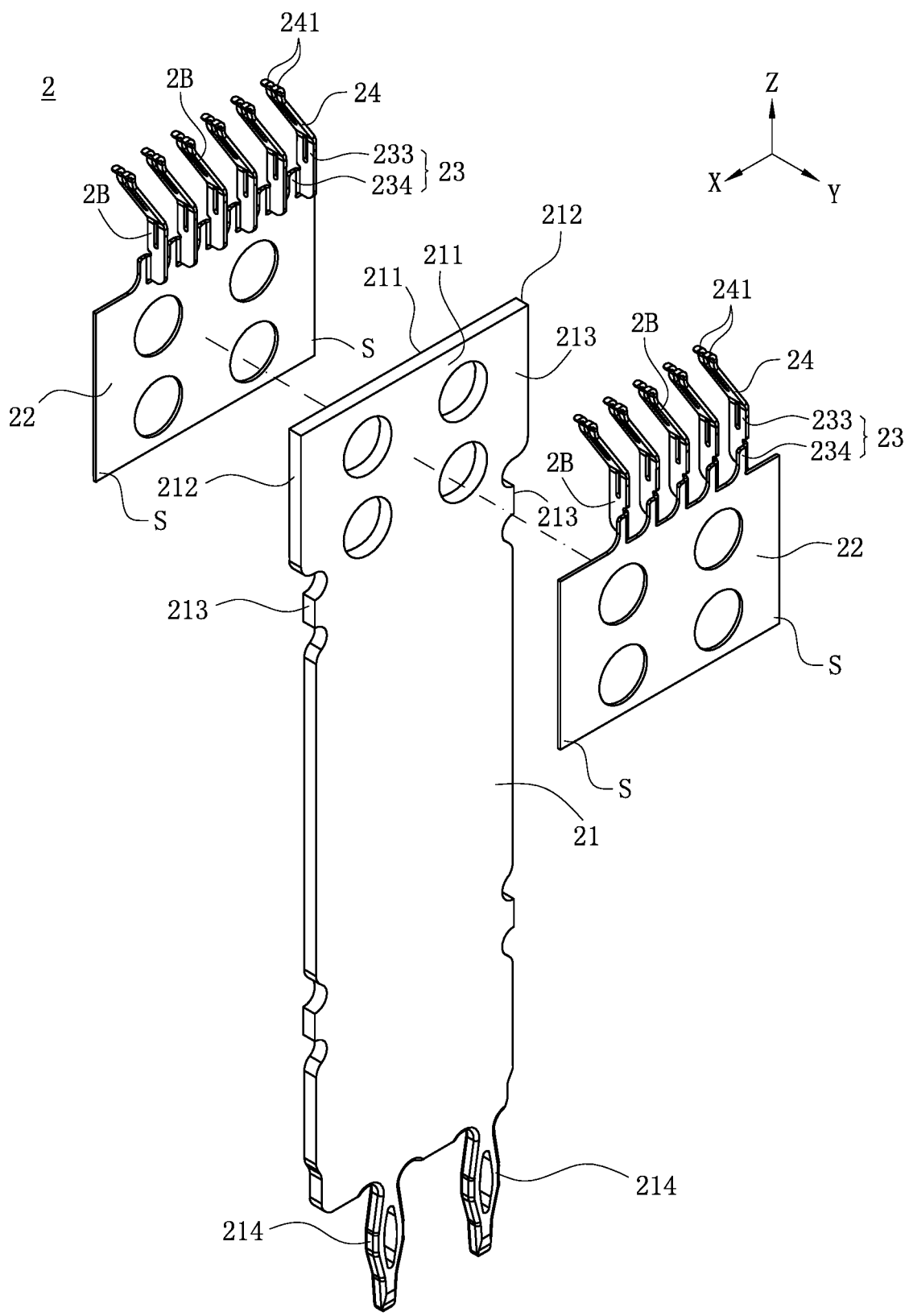
FIG. 12 is a perspective exploded view of the terminal in FIG. 11.
Figure 13:
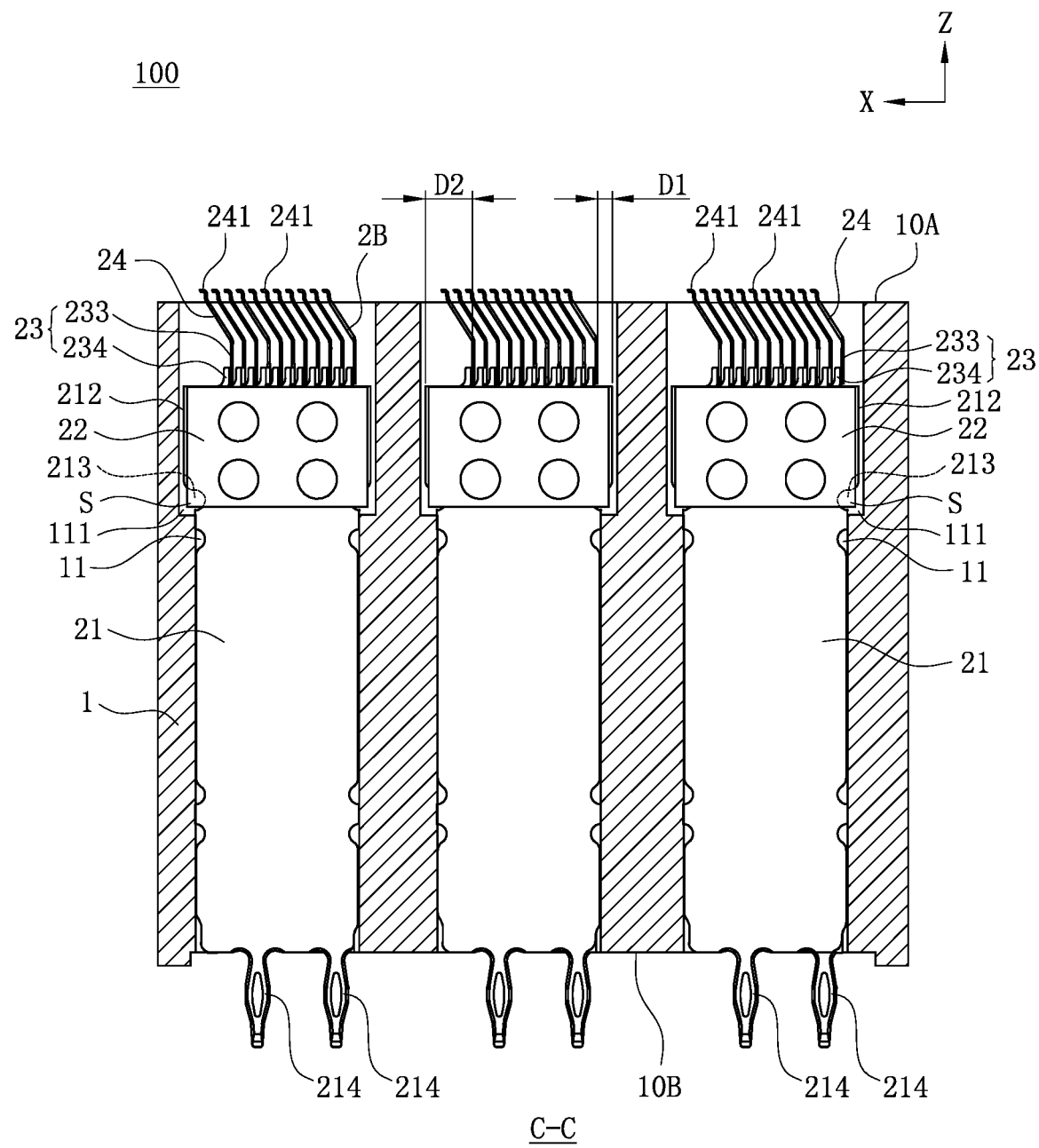
FIG. 13 is a sectional view of the electrical connector in FIG. 10, where the body is sectioned along the C-C direction.
Figure 14:
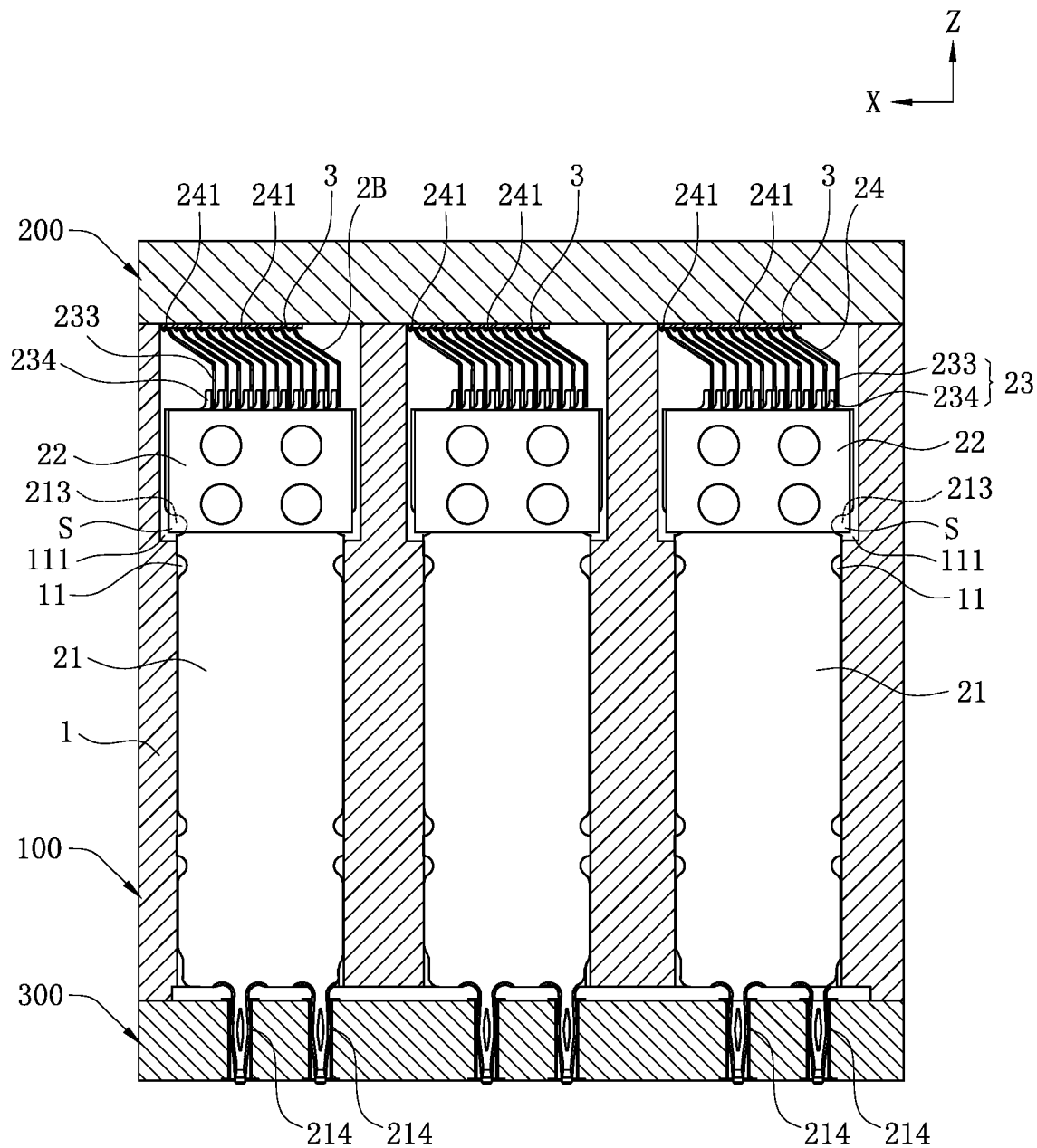
FIG. 14 is a schematic view of the electrical connector in FIG. 13 being conductively connected to an electronic component and a circuit board.

As shown in FIG. 9, the elastic arms 24 of a same terminal 2 are provided to extend forward along an extension direction of the long edges 211, and the two adjacent terminals 2 in the front-rear direction are separately provided in the X-axis direction, such that a horizontal space Z occupied by the two adjacent terminals 2 in the front-rear direction is located between the two adjacent short edges 212 of the two terminals 2, and the horizontal space Z is small, thereby facilitating providing more quantity of the terminals 2 on the body 1.

As shown in FIG. 4, FIG. 6 and FIG. 7, each of the elastic arms 24 has a plurality of contact portions 241 separately provided in the Y-axis direction. The contact portions 241 are located in front of the corresponding base 23, and the contact portions 241 are configured to be downward abutted by the electronic component 200 and to move downward. In other embodiments, each of the elastic arms 24 may have only one contact portion 241.

As shown in FIG. 7, the body 1 supports the electronic component 200 upward. The contact portions 241 of each of the terminals 2 upward abut a corresponding conductive pad 3 of the electronic component 200. The elastic arms 24 of the terminal 2 at a rear side thereof and the elastic arms 24 of the adjacent terminal 2 at the front side thereof are separately provided in the X-axis direction.

FIG. 10 to FIG. 14 show an electrical connector 100 according to a second embodiment of the present invention. The components of this embodiment structurally identical to those in the first embodiment are not hereinafter elaborated in this embodiment. The differences between this embodiment and the first embodiment exist in that:

In this embodiment, two position limiting portions S are respectively formed at the front side and the rear side of each of the connecting sheet 22, and each of the position limiting portions S covers the upper end of the corresponding notch 213 in the Y-axis direction. The two position limiting portions S at the left side or the right side of each terminal 2 are correspondingly accommodated in a corresponding position limiting slot 111. The position limiting slots 111 are used to limit the corresponding position limiting portions S from moving downward. Each of the bases 23 includes a bending portion 234 bending forward and extending from the flat plate portion 233. Each of the connecting sheets 22 is integrally connected with the lower ends of the bending portions 234 of the bases 23. The conductive members 2B are divided into two groups, and each of the two groups has multiple conductive members 2B. One of the connecting sheets 22 at the left side is integrally connected with one of the two groups of the conductive members 2B, and the other of the connecting sheets 22 at the right side is integrally connected with the other of the two groups of the conductive members 2B. The flat plate portion 233 is provided to form an angle relative to the connecting sheets 22. In this embodiment, the flat plate portion 233 is provided perpendicular to the connecting sheets 22. The conductive members 2B integrally connected by the two connecting sheets 22 are alternately arranged in the X-axis direction. In other words, in the front-rear direction, one conductive member 2B of the group of the conductive members 2B integrally connected with the connecting sheet 22 at the right side is provided between two adjacent conductive members 2B of the group of the conductive members 2B integrally connected with the connecting sheet 22 at the left side, and one conductive member 2B of the group of the conductive members 2B integrally connected with the connecting sheet 22 at the left side is provided between two adjacent conductive members 2B of the group of the conductive members 2B integrally connected with the connecting sheet 22 at the right side.

Figure 16:
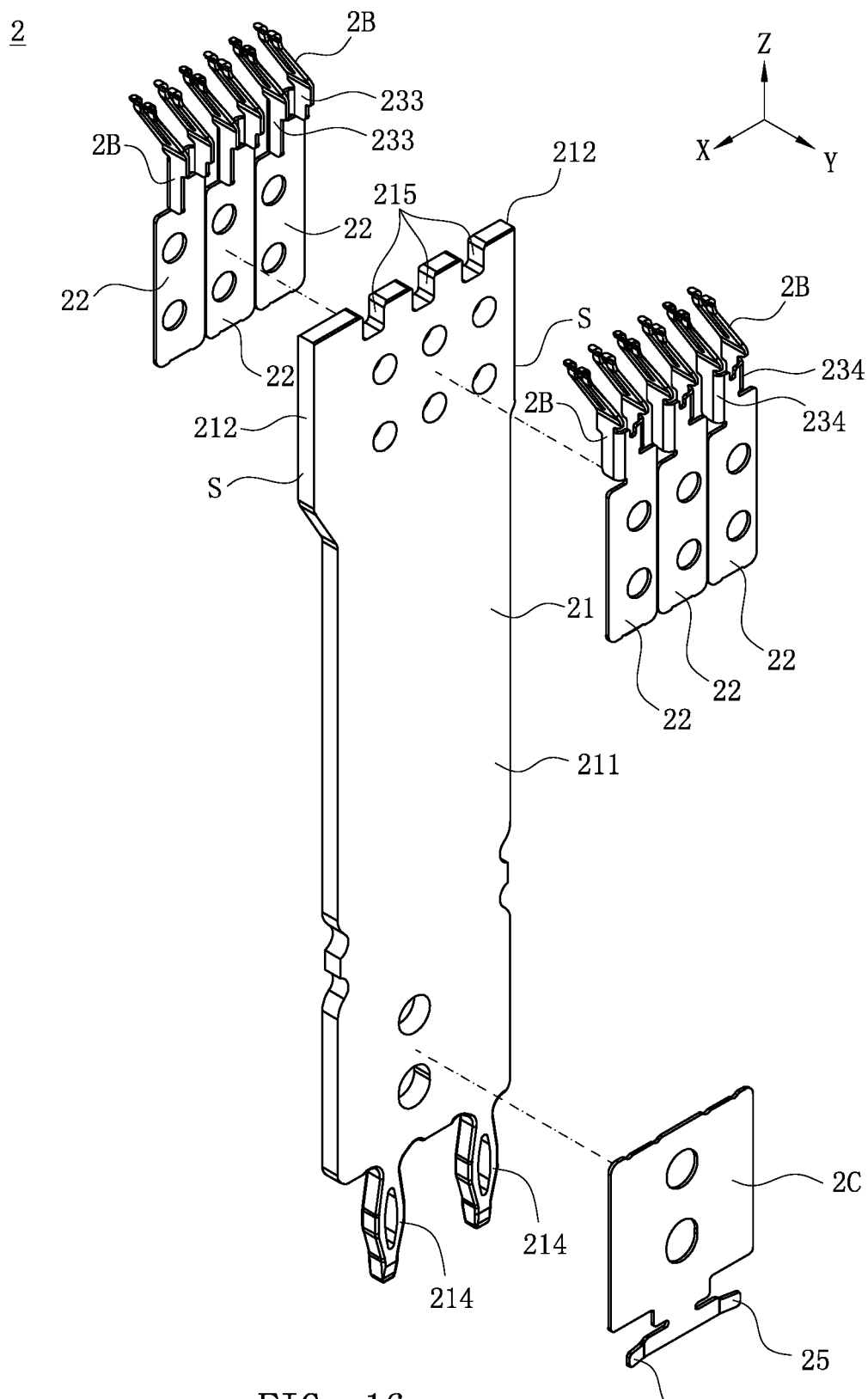
FIG. 16 is a perspective exploded view of a terminal in FIG. 15.

FIG. 15 to FIG. 23 show an electrical connector 100 according to a third embodiment of the present invention. The components of this embodiment structurally identical to those in the second embodiment are not hereinafter elaborated in this embodiment. The differences between this embodiment and the second embodiment exist in that:

As shown in FIG. 16, the left side and the right side of each of the metal plates 21 are respectively fixed with a plurality of connecting sheets 22. The connecting sheets 22 located at the same side of the metal plate 21 are arranged in the X-axis direction.

Figure 17:
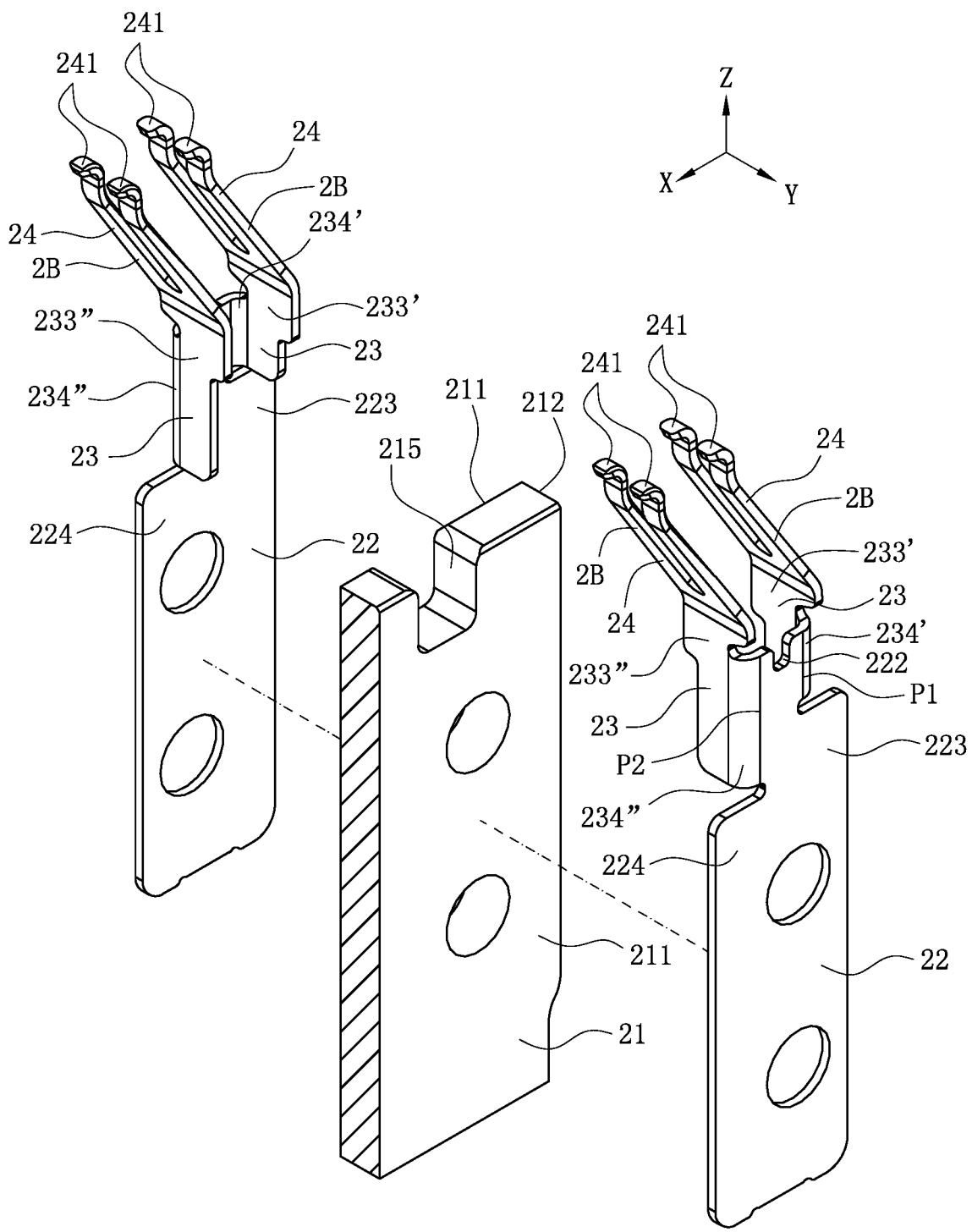
FIG. 17 is a partial perspective view of the terminal in FIG. 16.
Figure 18:
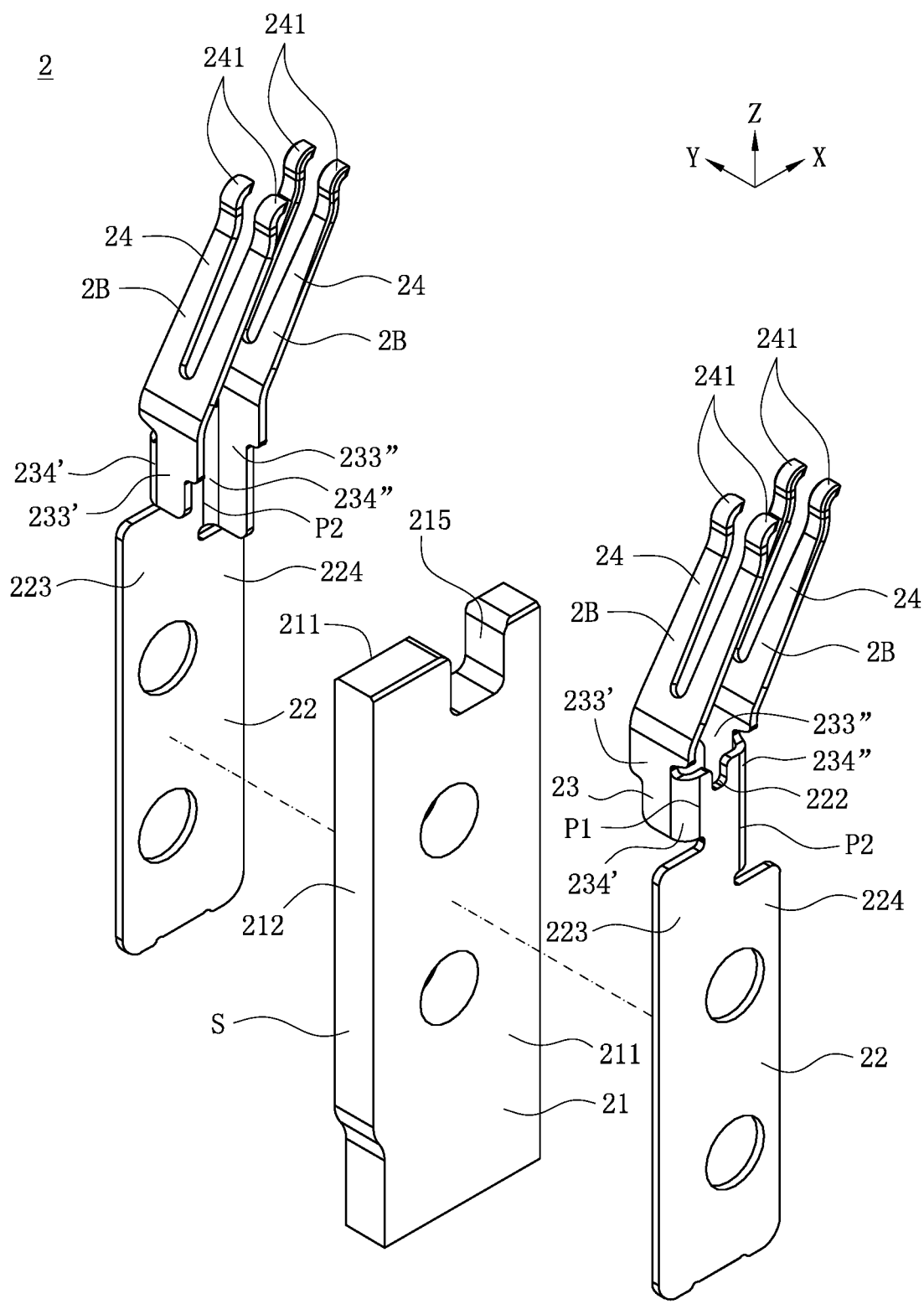
FIG. 18 is a perspective view of the terminal in FIG. 17 being rotated 180° clockwise along a horizontal direction.
Figure 20:
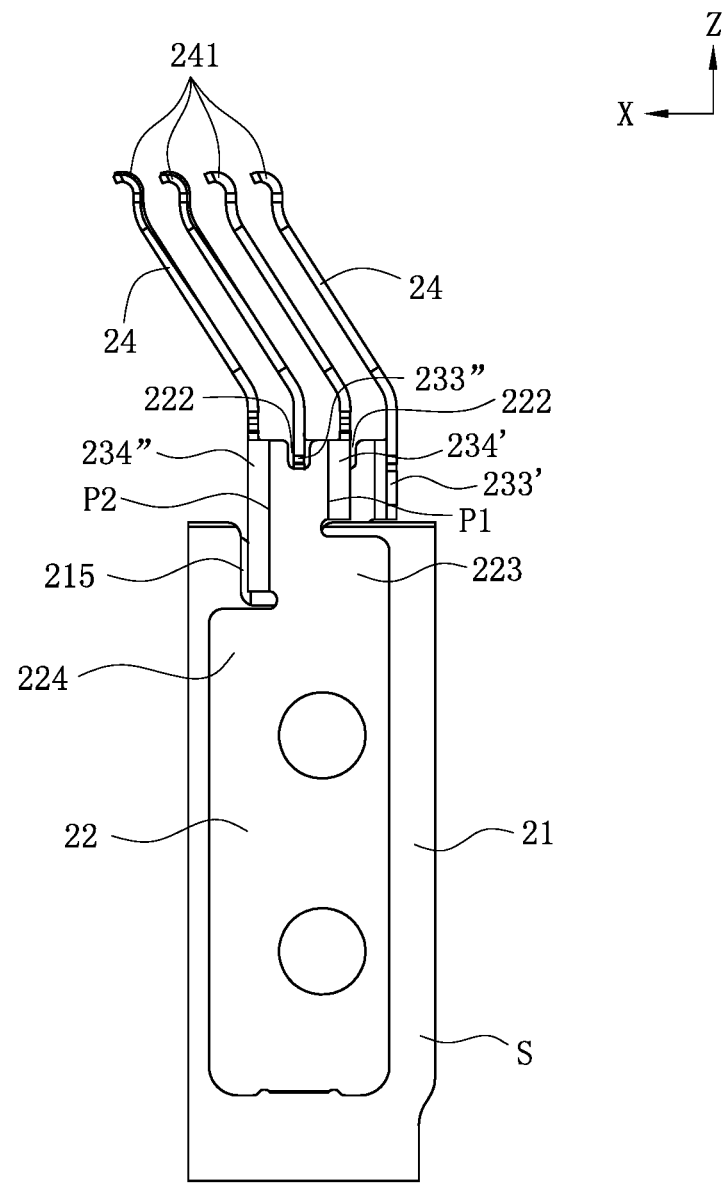
FIG. 20 is a left view of the terminal in FIG. 19.
Figure 21:
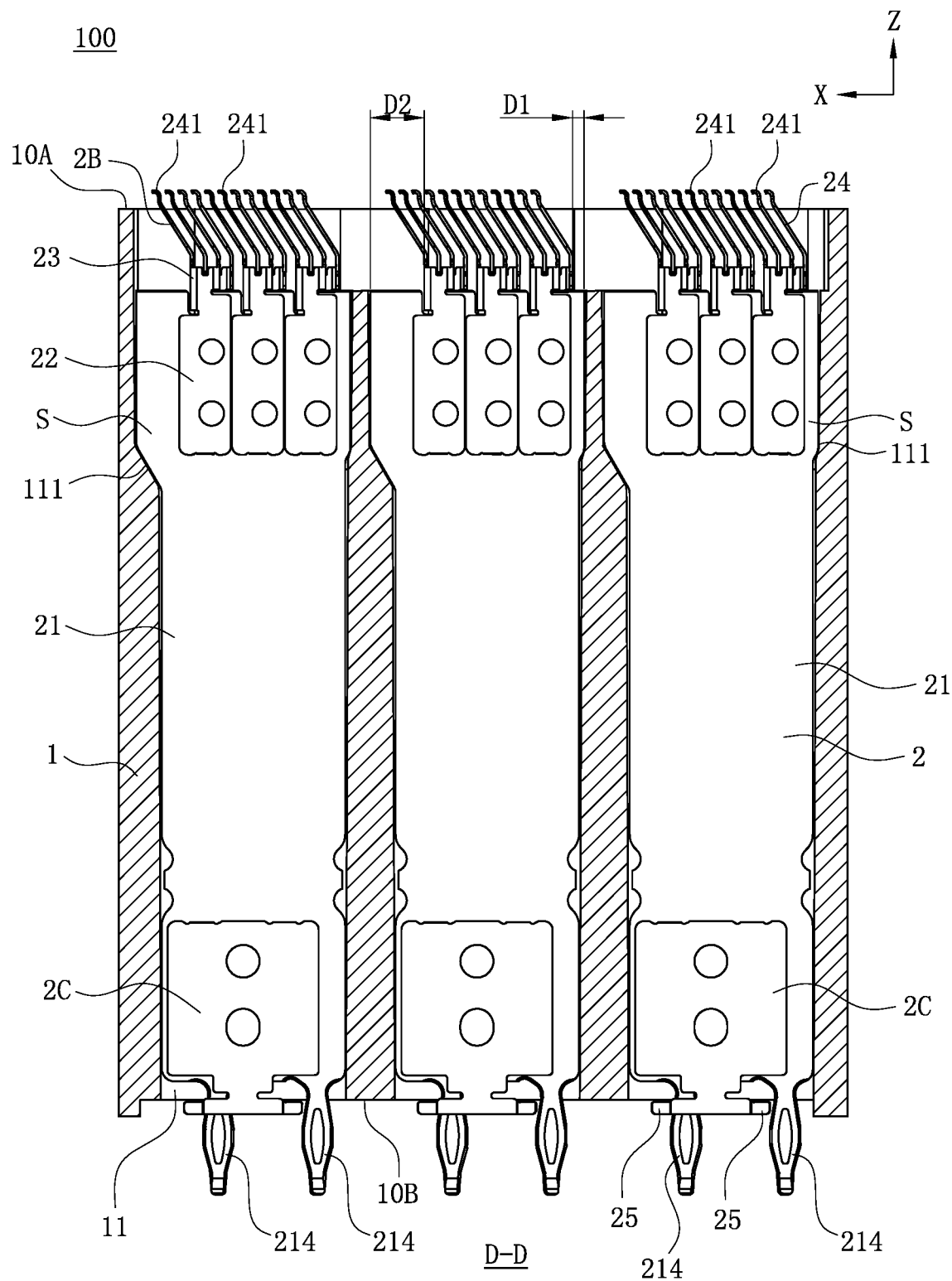
FIG. 21 is a sectional view of the electrical connector in FIG. 15, where the body is sectioned along the D-D direction.
Figure 22:
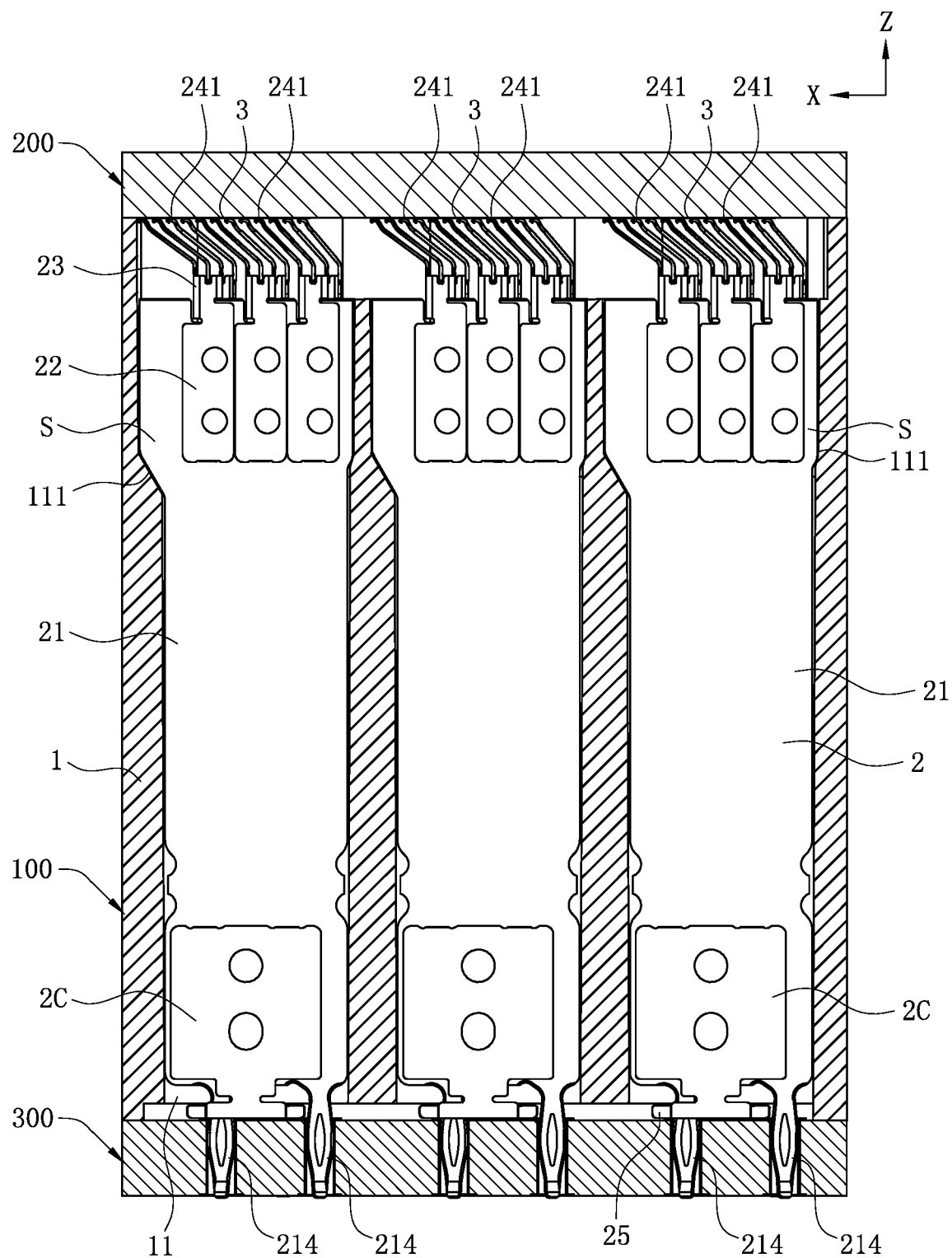
FIG. 22 is a schematic view of the electrical connector in FIG. 21 being conductively connected to an electronic component and a circuit board.

As shown in FIG. 17, FIG. 18 and FIG. 20, a rear side of each of the connecting sheets 22 is integrally connected with one of the bending portions 234, and a front side of each of the connecting sheets 22 is integrally connected with another one of the bending portions 234 (also referring to FIG. 16). The two bending portions 234 connected to each of the connecting sheets 22 are defined as a first bending portion 234' and a second bending portion 234". The upper ends of the first bending portion 234' and the second bending portion 234" are flush with each other, and a lower end of the first bending portion 234' is higher than a lower end of the second bending portion 234". In this embodiment, the first bending portion 234' is connected to the rear side of the corresponding connecting sheet 22, and the second bending portion 234" is connected to the front side of the corresponding connecting sheet 22.

Figure 19:
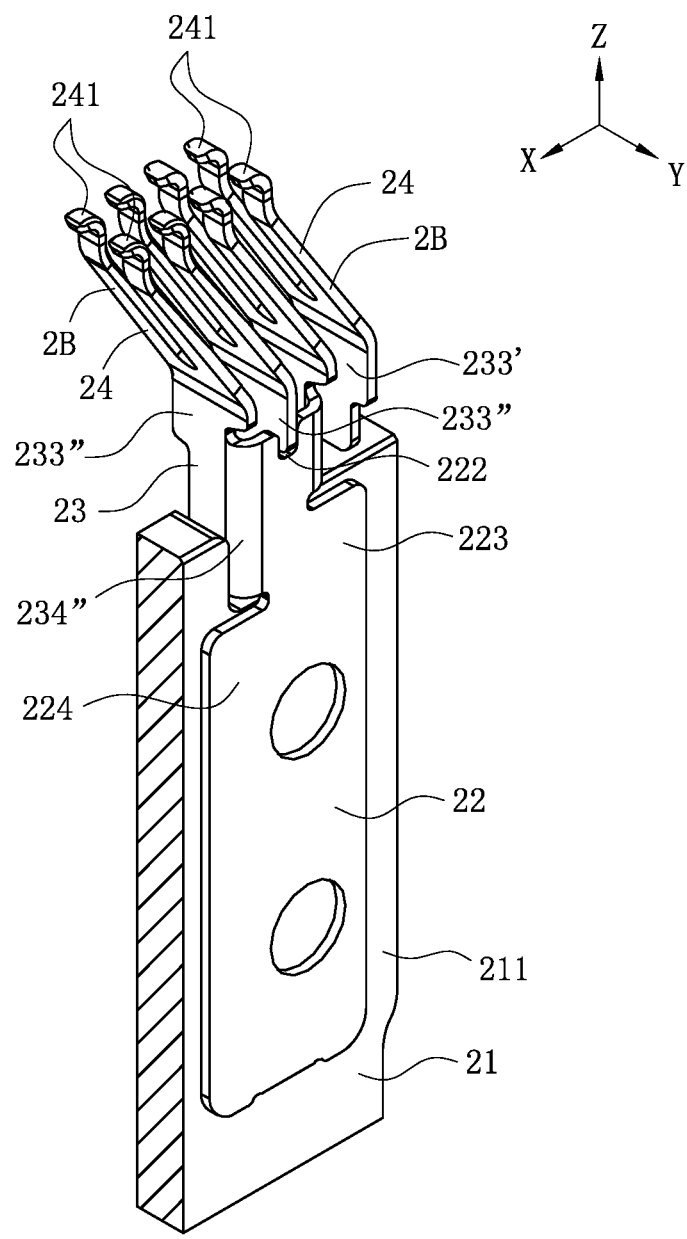
FIG. 19 is a perspective assembled view of the terminal in FIG. 17.

As shown in FIG. 19 and FIG. 20, the two conductive members 2B integrally connected to one of the connecting sheets 22 at the left side of the metal plate 21 and the two conductive members 2B integrally connected to one of the connecting sheets 22 at the right side of the metal plate 21 are arranged in a row and are arranged to be one-by-one staggered in the X-axis direction.

As shown in FIG. 16 to FIG. 18, the flat plate portion 233 connected to each of the first bending portions 234' is defined as a first flat plate portion 233', and the flat plate portion 233 connected to each of the second bending portions 234" is defined as a second flat plate portion 233". The first flat plate portions 233' and the second flat plate portions 233" of the conductive members 2B are in parallel to one another, and are arranged to be staggered in the X-axis direction.

As shown in FIG. 16 to FIG. 20, each connecting sheet 22 has a recess 222 formed by being concavely provided on a middle portion of an upper end of the connecting sheet 22. The flat plate portion 233 of one of the conductive members 2B connected to one of the connecting sheets 22 at one side of the metal plate 21 is accommodated in the recess 222 of one of the connecting sheets 22 at the other side of the metal plate 21. In this embodiment, the first flat plate portion 233' of one of the conductive members 2B connected to one of the connecting sheets 22 at the left side of the metal plate 21 is accommodated in the recess 222 of one of the connecting sheets 22 at the right side of the metal plate 21, and the second flat plate portion 233" of one of the conductive members 2B connected to one of the connecting sheets 22 at the right side of the metal plate 21 is accommodated in the recess 222 of one of the connecting sheets 22 at the left side of the metal plate 21. The first flat plate portions 233' and the second flat plate portions 233" adjacent to each other in the front-rear direction are arranged at the same interval in the X-axis direction.

As shown in FIG. 16 to FIG. 20, each connecting sheet 22 further has a first protruding portion 223 located below the first bending portion 234' and a second protruding portion 224 located below the second bending portion 234". The first protruding portion 223 protrudes backward relative to a connecting location P1 of the first bending portion 234' and the connecting sheet 22. An upper end of the first protruding portion 223 is higher than the lower end of the second bending portion 234", and a lower end of the first protruding portion 223 is lower than the lower end of the second bending portion 234". The upper end of the first protruding portion 223 is not higher than the upper end of the metal plate 21, and the first protruding portion 223 and the metal plate 21 are fixed by attaching. In this embodiment, the upper end of the first protruding portion 223 is lower than the upper end of the metal plate 21. The second protruding portion 224 protrudes forward relative to a connecting location P2 of the second bending portion 234" and the connecting sheet 22. A forward protruding length of the second protruding portion 224 is equal to a backward protruding length of the first protruding portion 223. A lower end of the second protruding portion 224 and the lower end of the first protruding portion 223 are flush with each other, and the second protruding portion 224 and the metal plate 21 are fixed by attaching.

As shown in FIG. 16 FIG. 17 and FIG. 19, the metal plate 21 has a plurality of opening holes 215 downward concavely provided on an upper end of the metal plate 21 and provided separately in the X-axis direction. The second flat plate portions 233" of two conductive members 2B connected with the two connecting sheets 22 located at the left side and the right side of the metal plate 21 are accommodated in a same one of the opening holes 215.

Figure 15:
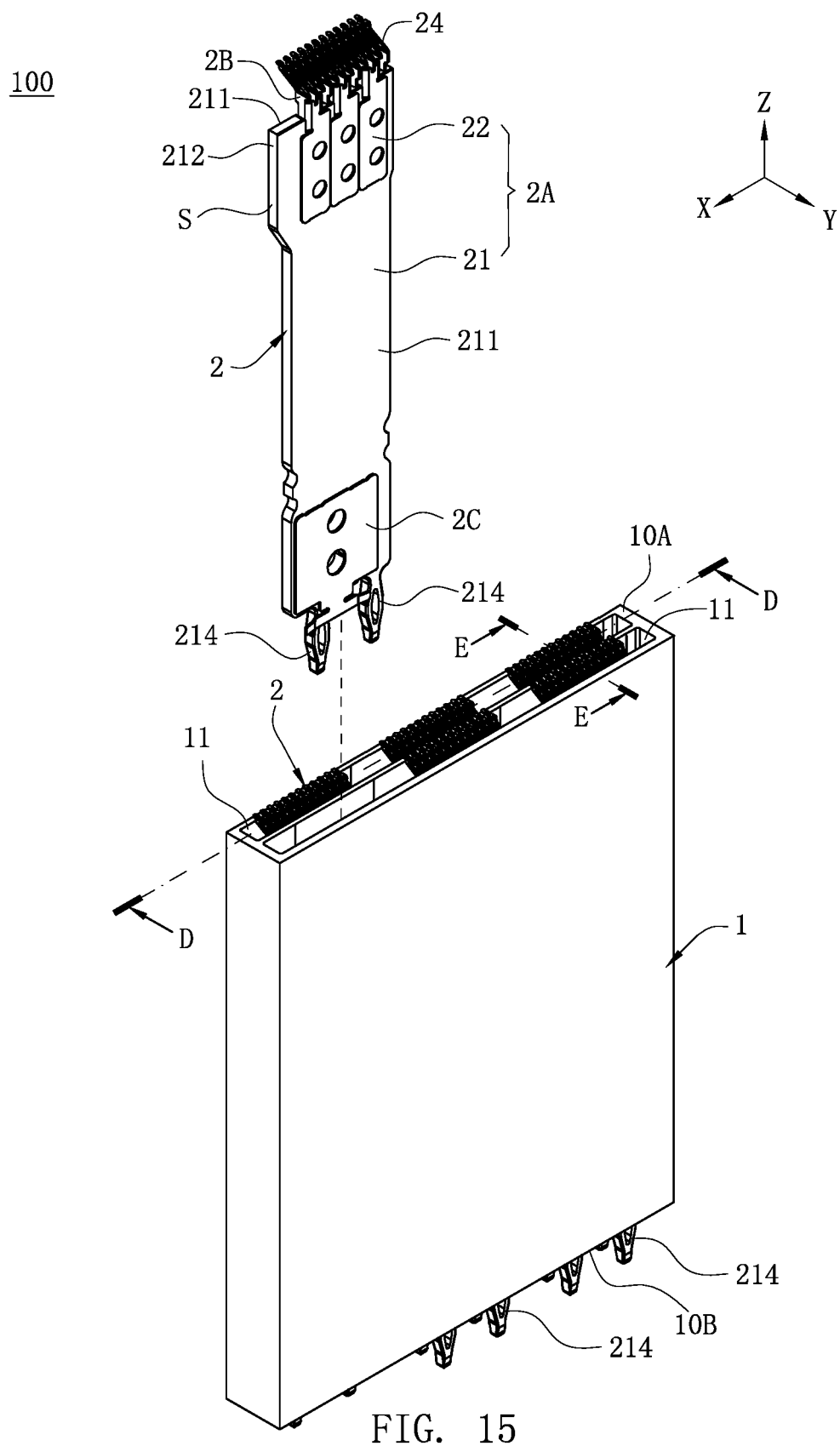
FIG. 15 is a perspective view of an electrical connector according to a third embodiment of the present invention.
Figure 23:
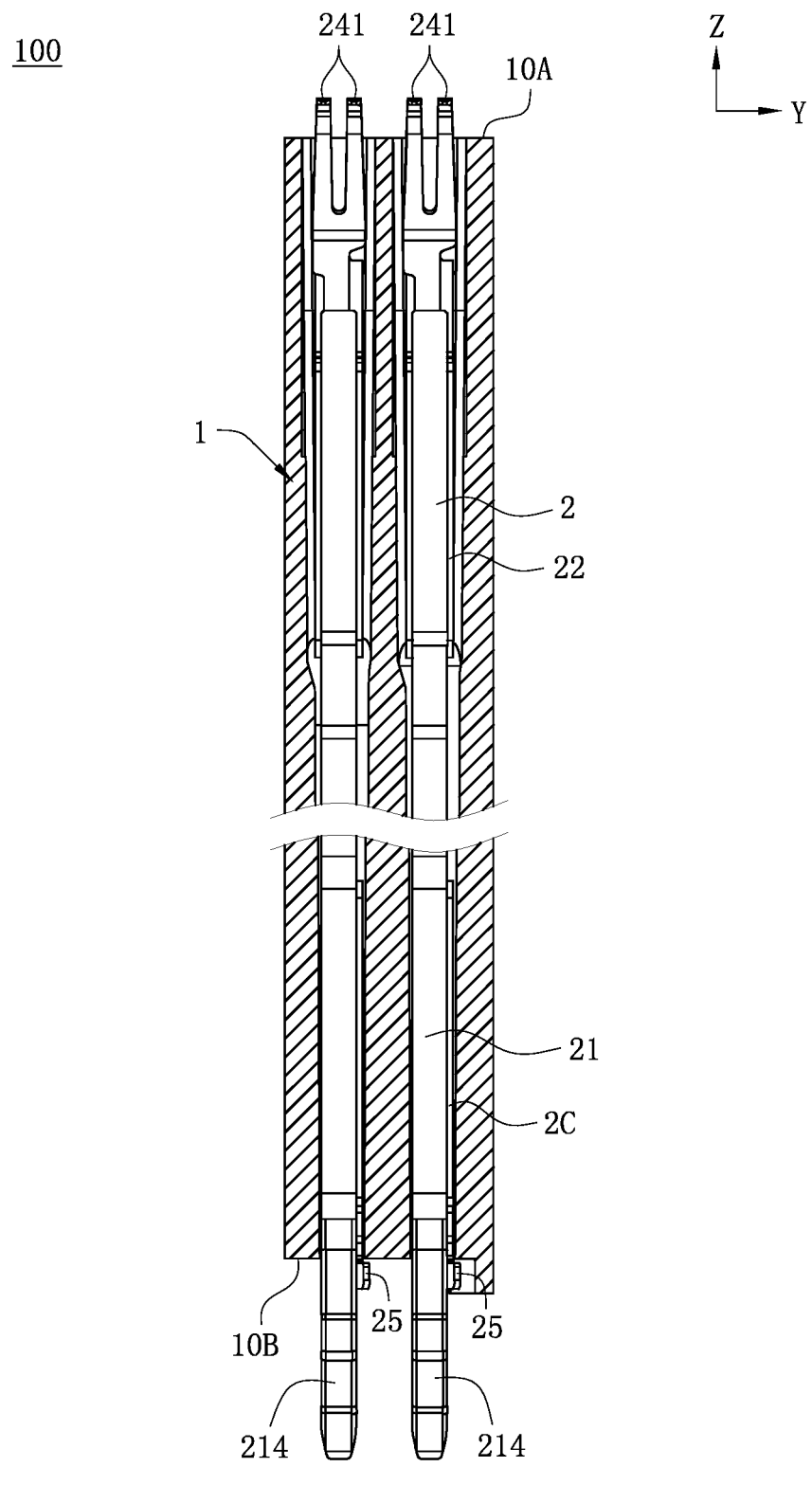
FIG. 23 is a sectional view of the electrical connector in FIG. 15, where the body is sectioned along the E-E direction.

As shown in FIG. 15, FIG. 16 and FIG. 23, each of the terminals 2 further includes a stopping sheet 2C fixed to one of the left side and the right side of the metal plate 21. The stopping sheet 2C is made of a metal plate material. A plate thickness of the stopping sheet 2C is less than a plate thickness of the metal plate 21, and is equal to a plate thickness of each of the connecting sheets 22. The stopping sheet 2C has two stopping portions 25 formed by extending away relative to the metal plate 21 in the Y-axis direction. The stopping portions 25 are located below the lower surface 10B and match with the lower surface 10B to limit the corresponding terminal 2 from moving upward. In other embodiments, each of the stopping sheets 2C may have only one stopping portion 25.

Compared with the related art, the electrical connector 100 according to certain embodiments of the present invention has the following beneficial effects:

(1) The conductive members 2B are arranged along the extending direction of the long edges 211, such that more quantity of the conductive members 2B may be provided in the limited space of the main body member 2A, and more contact points exist between each of the terminals 2 and the electronic component 200, thus ensuring good electrical conductivity between each of the terminals 2 and the electronic component 200. The vertical flat plate portion 233 downward covers the main body member 2A correspondingly, and the elastic arm 24 is formed by extending upward from an upper end of the flat plate portion 233, ensuring most of the conductive members 2B are located right above the main body member 2A correspondingly, thereby reducing a space occupied by each terminal 2 in the body 1 along the Y-axis direction, and further facilitating providing more quantity of the terminals 2 on the body 1. The elastic arms 24 are provided to extend forward along the direction of the long edges 211, and the two adjacent terminals 2 in the X-axis direction are separately provided in the front-rear direction, facilitating replacing one of the terminals 2 being damaged individually, and a horizontal space Z occupied by the two adjacent terminals 2 in the front-rear direction is located between the two adjacent short edges 212 of the two terminals 2, such that the horizontal space Z is small, thereby facilitating providing more quantity of the terminals 2 on the body 1.

(2) The supporting leg 232 and the elastic arms 24 are all formed by bending forward and extending. The supporting leg 232 abuts the upper end of the main body member 2A, and is used to disperse the downward pressure by the electronic component 200 toward the elastic arms 24, thereby preventing the conductive members 2B from being over-pressed and damaged. The gap D1 between the short edge 212 at the rear side thereof and a base 23 adjacent thereto is less than the gap D2 between the short edge 212 at the front side thereof and another base 23 adjacent thereto, such that the conductive members 2B are provided to be close to the rear side of the main body member 2A, ensuring the main body member 2A to have sufficient space to support the supporting leg 232 bending forward and extending.

(3) The bases 23 are accommodated in the corresponding grooves 221, such that the conductive members 2B may be accurately positioned in the predetermined locations of the corresponding main body member 2A. The bases 23 are soldered and fixed to the corresponding grooves 21, such that the two components are firmly connected, thus ensuring the terminals 2 to be assembled to the corresponding accommodating holes 11 as a whole.

(4) The bases 23 laterally protrude out of the corresponding main body member 2A and are accommodated in the corresponding grooves 221, such that the conductive members 2B may be accurately positioned in the predetermined locations of the corresponding main body member 2A.

(5) The plate material of each of the conductive members 2B occupies a relatively large space, such that the gap between the two adjacent conductive members 2B in the front-rear direction on each of the connecting sheets 22 is relatively large, resulting in the limited quantity of the conductive members 2B integrally connected by each of the connecting sheets 22. The two groups of the conductive members 2B integrally connected by the two connecting sheets 22 are alternately arranged in the X-axis direction, ensuring that each of the terminals 2 may be provided with more quantity of the conductive members 2B.

(6) The connecting sheets 22 located at the same side of the metal plate 21 are arranged in the X-axis direction. The rear side of each of the connecting sheets 22 is integrally connected with one of the first bending portions 234', and the front side of each of the connecting sheets 22 is integrally connected with one of the second bending portions 234", such that even if the widths of the corresponding first flat plate portion 234' and the second flat plate portion 234" in the Y-axis direction are increased, the predetermined positions of the two connecting sheets 22 adjacent in the front-rear direction are not affect, thereby increasing the width of the elastic arm 24 in the Y-axis direction correspondingly, and supporting the electronic component 200 upward more reliably.

(7) The first protruding portion 223 protrudes backward out of a connecting location P1 of the first bending portion 234' and the connecting sheet 22, and passes upward beyond the lower end of the second bending portion 234" and passes downward beyond the lower end of the second bending portion 234". The first protruding portion 223 is used for the mold to press thereon, thereby easily forming the second bending portion 234" having the greater strength, and further increasing the soldering and fixing area between the connecting sheet 22 and the metal plate 21.

(8) The metal plate 21 accommodates the flat plate portions 233 by providing with the opening holes 215, thereby reducing the heights of the corresponding connecting sheets 22, such that the first protruding portion 223 corresponding to each of the connecting sheets 22 may be in contact with the metal plate 21, and further allowing the soldering and fixing of the two components. The second flat plate portions 233" of two conductive members 2B connected with the two connecting sheets 22 located at the left side and the right side of the metal plate 21 are accommodated in a same one of the opening holes 215. Each of the opening holes 215 is used to position the two corresponding conductive members 2B.

(9) The recess 222 accommodates the flat plate portion 233 to perform the positioning function, such that the two conductive members 2B integrally connected to one of the connecting sheets 22 at the left side of the metal plate 21 and the two conductive members 2B integrally connected to one of the connecting sheets 22 at the right side of the metal plate 21 are arranged in a row and are arranged to be one-by-one staggered in the X-axis direction. Meanwhile, in the downward elastic deforming process of the two elastic arms 24 adjacent in the front-rear direction, an interval between the corresponding first flat plate portion 233' and the second flat plate portion 233" is ensured to maintain basically unchanged, such that the elastic arms 24 apply balanced forces to the corresponding conductive pads 3 of the electronic component 200.

(10) The stopping portions 25 are provided on the stopping sheet 2C, which has a small plate thickness. Compared to being provided on the metal plate 21, which has a greater plate thickness, the stopping portions 25 may be easily formed and have better elasticity, ensuring the stopping portions 25 to easily move downward to be below the lower surface 10B, and thereby limiting the corresponding terminal 2 from moving upward.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, conductively connected to an electronic component, the electrical connector comprising:
    a body, provided with a plurality of accommodating holes running through the body vertically; and
    a plurality of terminals, correspondingly accommodated in the accommodating holes, wherein each of the terminals comprises a main body member and a plurality of conductive members, the main body member has two long edges opposite to each other in a left-right direction and two short edges connecting the two long edges, each of the long edges is provided to extend in a front-rear direction, the conductive members are arranged in the front-rear direction, each of the conductive members has a base electrically connected to the main body member and an elastic arm formed by extending upward from the base and in the front-rear direction, the base has a flat plate portion being vertical, the flat plate portion downward covers the main body member correspondingly, and the elastic arm is formed by extending upward from an upper end of the flat plate portion,
    wherein the elastic arm of each of the conductive members has at least one contact portion located in front of the corresponding base of each of the conductive members, the contact portion is configured to be downward abutted by the electronic component and to move downward, and two adjacent ones of the terminals in the front-rear direction are separately provided in the front-rear direction.

2. The electrical connector according to claim 1, wherein a gap between one of the short edges located at a front side thereof and one of the bases of the conductive members adjacent thereto is greater than a gap between the other of the short edges located at a rear side thereof and another one of the bases of the conductive members adjacent thereto.

3. The electrical connector according to claim 1, wherein at least one side of a left side and a right side of the main body member is concavely provided with a plurality of grooves, and the grooves correspondingly position the bases of the conductive members.

4. The electrical connector according to claim 3, wherein each of the grooves and a corresponding one of the bases of the conductive members are fixed by soldering.

5. The electrical connector according to claim 3, wherein the grooves are distributed at the left side and the right side of the main body member, each of the bases of the conductive members has two insertion legs, the two insertion legs are inserted into two of the grooves provided at the left side and the right side of the main body member.

6. The electrical connector according to claim 3, wherein each of the bases of the conductive members has a supporting leg formed by bending forward and extending, and the supporting leg abuts the upper end of the main body member.

7. The electrical connector according to claim 6, wherein the supporting leg and the upper end of the main body member are correspondingly fixed by soldering.

8. The electrical connector according to claim 3, wherein the main body member comprises a metal plate and two connecting sheets respectively fixed to a left side and a right side of the metal plate, each of the connecting sheets is provided with the grooves running therethrough in the left-right direction, and the base is positioned in two of the grooves of the two connecting sheets.

9. The electrical connector according to claim 1, wherein a left side and a right side of each of the accommodating holes are respectively concavely provided with a plurality of positioning slots, the positioning slots run upward through the body, and two of the positioning slots opposite to each other in the left-right direction correspondingly position one of the bases of the conductive members.

10. The electrical connector according to claim 1, wherein the main body member comprises a metal plate and a connecting sheet fixed to one of a left side and a right side of the metal plate, the bases of the conductive members are integrally connected by the connecting sheet, and the flat plate portion is provided to form an angle relative to the connecting sheet.

11. The electrical connector according to claim 10, wherein the base comprises a bending portion bending forward and extending from the flat plate portion, and the bending portions of the conductive members are connected to the connecting sheet.

12. The electrical connector according to claim 10, wherein the main body member comprises two connecting sheets, each of the left side and a right side of the metal plate is fixed with one of the two connecting sheets, the conductive members are divided into two groups, one of the two connecting sheets is integrally connected with one of the two groups of the conductive members, and the other of the two connecting sheets is integrally connected with the other of the two groups of the conductive members.

13. The electrical connector according to claim 12, wherein the one of the two groups of the conductive members and the other of the two groups of the conductive members are alternately arranged in the front-rear direction.

14. The electrical connector according to claim 1, wherein the main body member comprises a metal plate and a plurality of connecting sheets respectively fixed to one of a left side and a right side of the metal plate, the connecting sheets are arranged in the front-rear direction, the base has a bending portion bending and extending from the flat portion, a rear side of each of the connecting sheets is integrally connected with one of the bending portions of the conductive members, and a front side of each of the connecting sheets is integrally connected with another one of the bending portions of the conductive members.

15. The electrical connector according to claim 14, wherein:
the two bending portions connected to each of the connecting sheets are defined as a first bending portion and a second bending portion, and a lower end of the second bending portion is lower than a lower end of the first bending portion; and
each respective connecting sheet of the connecting sheets has a first protruding portion located below the first bending portion, the first protruding portion protrudes in the front-rear direction relative to a connecting location of the first bending portion and the respective connecting sheet, an upper end of the first protruding portion is higher than the lower end of the second bending portion, and a lower end of the first protruding portion is lower than the lower end of the second bending portion.

16. The electrical connector according to claim 15, wherein the first protruding portion and the metal plate are fixed by attaching.

17. The electrical connector according to claim 15, wherein each respective connecting sheet of the connecting sheets further has a second protruding portion located below the second bending portion, the second protruding portion protrudes in the front-rear direction relative to a connecting location of the second bending portion and the respective connecting sheet, and the second protruding portion and the first protruding portion protrude toward opposite directions.

18. The electrical connector according to claim 15, wherein the metal plate has a plurality of opening holes downward concavely provided on an upper end of the metal plate and provided separately in the front-rear direction, each of the opening holes accommodates the flat plate portion which is connected to one of the second bending portions of the conductive members, and the upper end of the protruding portion is not higher than the upper end of the metal plate.

19. The electrical connector according to claim 14, wherein the left side and the right side of the metal plate are respectively fixed with the connecting sheets, the two conductive members integrally connected to one of the connecting sheets at the left side of the metal plate and the two conductive members integrally connected to one of the connecting sheets at the right side of the metal plate are arranged to be one-by-one staggered in the front-rear direction, each of the connecting sheets has a recess, and the flat plate portion of one of the conductive members connected to one of the connecting sheets at one of the left side and the right side of the metal plate is accommodated in the recess of one of the connecting sheets at the other of the left side and the right side of the metal plate.

20. The electrical connector according to claim 1, wherein each of the terminals further comprises a stopping sheet fixed to one of a left side and a right side of the metal plate, the stopping sheet is made of a metal plate material, a plate thickness of the stopping sheet is less than a plate thickness of the metal plate, the stopping sheet has at least one stopping portion formed by extending away relative to the metal plate in the left-right direction, and the at least one stopping portion matches with the body to limit the corresponding terminal from moving upward.

* * * * *